United States Patent
Kobayashi et al.

(10) Patent No.: US 6,476,867 B1
(45) Date of Patent: *Nov. 5, 2002

(54) PHOTOELECTRIC CONVERSION APPARATUS, DRIVING METHOD AND X-RAY IMAGE PICKUP APPARATUS USING THE SAME

(75) Inventors: Isao Kobayashi, Atsugi; Noriyuki Kaifu, Hachioji; Shinichi Takeda, Atsugi; Masakazu Morishita, Hiratsuka; Tadao Endo, Atsugi, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/717,628

(22) Filed: Sep. 23, 1996

(30) Foreign Application Priority Data

Sep. 28, 1995 (JP) ............................................. 7-250512

(51) Int. Cl.[7] .............................................. H04N 5/335
(52) U.S. Cl. .................... 348/307; 348/304; 348/214.1; 378/98.8
(58) Field of Search ....................... 257/444; 250/208.1, 250/214.1; 348/302, 304, 308, 307, 222, 341; 378/98.8

(56) References Cited

U.S. PATENT DOCUMENTS

| | | | |
|---|---|---|---|
| 4,169,273 A | * 9/1979 | Hendrickson | 348/311 |
| 4,571,624 A | * 2/1986 | Nishizawa et al. | 348/307 |
| 4,745,488 A | 5/1988 | Kaifu et al. | 358/294 |
| 5,043,719 A | 8/1991 | Nakagawa et al. | 340/825.79 |
| 5,060,040 A | 10/1991 | Saika et al. | 357/30 |
| 5,233,442 A | 8/1993 | Kawai et al. | 358/482 |
| 5,262,850 A | * 11/1993 | Hashimoto | 348/307 |
| 5,272,548 A | 12/1993 | Kawai et al. | 358/482 |
| 5,288,988 A | * 2/1994 | Hashimoto | 348/302 |
| 5,317,406 A | 5/1994 | Kobayashi et al. | 348/307 |
| 5,335,094 A | 8/1994 | Kaifu et al. | 358/494 |
| 5,420,452 A | * 5/1995 | Tran et al. | 257/444 |
| 5,463,420 A | * 10/1995 | Yamada | 250/208 |
| 5,812,109 A | * 9/1998 | Kaifu et al. | 250/208.1 |
| 5,999,150 A | * 12/1999 | Nighan et al. | 345/79 |

* cited by examiner

Primary Examiner—Andrew B. Christensen
Assistant Examiner—Jacqueline Wilson
(74) Attorney, Agent, or Firm—Fitzpatrick, Cella, Harper & Scinto

(57) ABSTRACT

In order to realize a photoelectric conversion apparatus capable of easily switching a mode requiring a wide dynamic range in obtaining a motion image and a mode requiring a reduction in noise in obtaining a still image, a mode switching means is used, when a refresh operation is performed for each photoelectric conversion element, to switch between a mode of setting the potential of one electrode of the photoelectric conversion element to be higher than the potential of the other electrode, and a mode of setting the potential of one electrode of the photoelectric conversion element to be lower than the potential of the other electrode, thereby arbitrarily changing the refresh voltage. With this operation, desired photoelectric conversion signals for a motion image and a still image can be obtained.

38 Claims, 21 Drawing Sheets

$VrG \leq VD - VFB$ $V_{FB} = 0$ $V_{FB} > 0$ $V_{FB} < 0$ $V_{rG} < V_D - V_{FB}$ PRIOR ART  FIG. 21
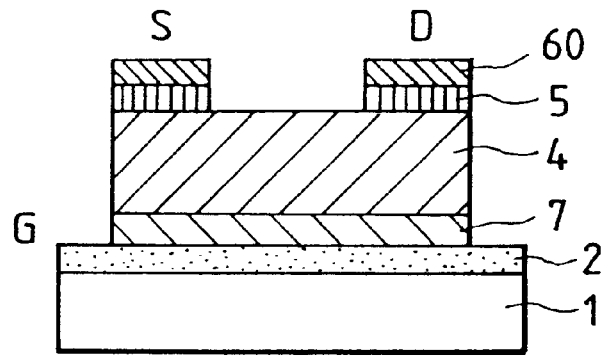
FIG. 22
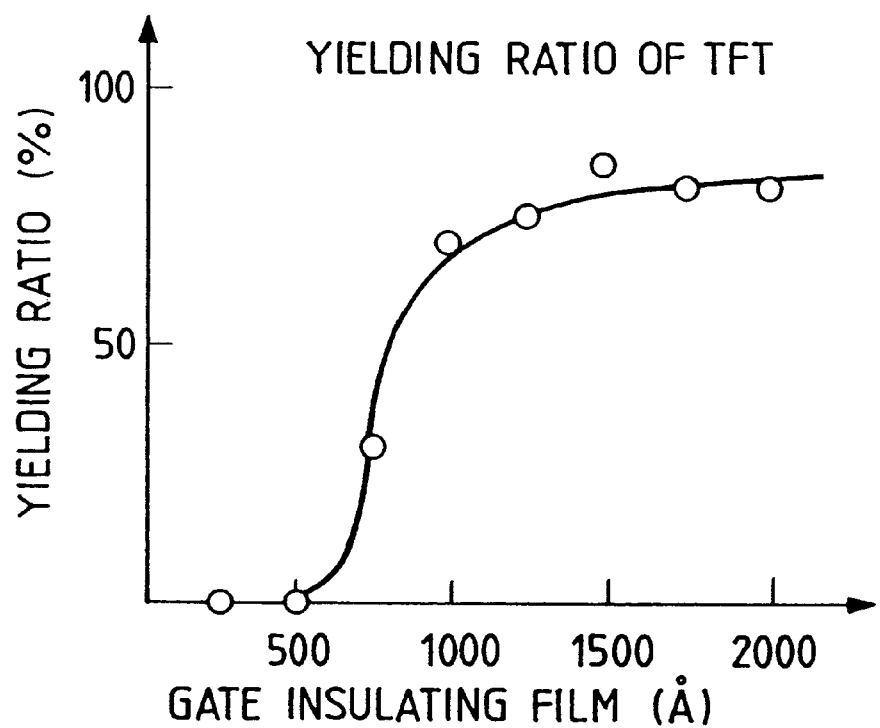

PHOTOELECTRIC CONVERSION APPARATUS, DRIVING METHOD AND X-RAY IMAGE PICKUP APPARATUS USING THE SAME

BACKGROUND OF THE INVENTION

1. Field of the Invention

The present invention relates a photoelectric conversion apparatus, a driving method therefor, and an X-ray system having the apparatus and, more particularly, to a one- or two-dimensional photoelectric conversion apparatus capable of performing a one-to-one read operation in a facsimile apparatus, a digital copying machine, an X-ray image pickup apparatus, or the like, a driving method for the apparatus, and a system having the apparatus.

2. Related Background Art

Conventionally, as the read system of a facsimile apparatus, a digital copying machine, an X-ray image pickup apparatus, or the like, a read system using a reducing optical system and a CCD type sensor has been used. With the recent development in photoelectric conversion semiconductor materials typified by hydrogenated amorphous silicon (to be referred to as a-Si hereinafter), there has been a remarkable development in a so-called contact type sensor, which is obtained by forming photoelectric conversion elements and a signal processing unit on a substrate having a large area, and designed to read an image of an information source through a one-to-one optical system. Since a-Si can be used not only as a photoelectric conversion material but also as a thin-film field effect transistor (to be referred to as a TFT hereinafter), a photoelectric conversion semiconductor layer and a TFT semiconductor layer can be formed at the same time.

FIGS. 20A to 20C show the structures of conventional optical sensors. FIGS. 20A and 20B show the layer structures of two types of optical sensors. FIG. 20C shows a typical driving method common to these sensors. Both the sensors in FIGS. 20A and 20B are photodiode type optical sensors. The sensor in FIG. 20A is of a PIN type. The sensor in FIG. 20B is of a Schottky type. The sensor in FIG. 20A includes an insulating substrate 1, a lower electrode 2, a p-type semiconductor layer (p-layer) 3, an intrinsic semiconductor layer (i-layer) 4, an n-type semiconductor layer (n-layer) 5, and a transparent electrode 6. The sensor in FIG. 20B includes the same components as those of the sensor in FIG. 20A except for the p-layer 3. In the Schottky type sensor in FIG. 20B, a proper material is selected for the lower electrode 2 to form a Schottky barrier such that no electrons are injected from the lower electrode 2 into the i-layer 4. The arrangement in FIG. 20C includes an optical sensor 10 as a symbol representing the above optical sensor, a power supply 11, and a detection unit 12 such as a current amplifier. The direction indicated by "C" in the optical sensor 10 corresponds to the transparent electrode 6 side in FIGS. 20A and 20B, whereas the direction indicated by "A" corresponds to the lower electrode 2 side. The power supply 11 is set to apply a positive voltage to the "C" side opposing the "A" side. The operation of this arrangement will be briefly described. When light is incident from the direction indicated by the arrow in each of FIGS. 20A and 20B, and reaches the i-layer 4, the light is absorbed to generate electrons and holes. Since an electric field has been applied from the power supply 11 to the i-layer 4, the electrons pass through the "C" side, i.e., the n-layer 5, and move to the transparent electrode 6, while the holes move to the "A" side, i.e., the lower electrode 2. That is, a photocurrent flows in the optical sensor 10. When no light is incident, neither electrons nor holes are generated in the i-layer 4. In addition, the n-layer 5 serves as a hole injection inhibiting layer, and the p-layer 3 in the PIN type sensor in FIG. 20A and the Schottky barrier layer in the Schottky type sensor in FIG. 20B serve as electron injection inhibiting layers. For this reason, the holes in the transparent electrode 6 and the electrons in the lower electrode 2 cannot move, and hence no current flows. Therefore, a change in current occurs in accordance with the presence/absence of incident light. If this change is detected by the detection unit 12 in FIG. 20C, this arrangement operates as an optical sensor.

It is, however, difficult to manufacture a photoelectric conversion apparatus with a high S/N ratio at a low cost by using the above conventional optical sensor. The following are the reasons.

The first reason is that the PIN type sensor in FIG. 20A and the Schottky type sensor in FIG. 20B each require injection inhibiting layers at two portions. In the PIN type sensor in FIG. 20A, the n-layer 5 as an injection inhibiting layer needs to have both the characteristic that guides electrons to the transparent electrode 6 and the characteristic that inhibits injection of holes into the i-layer 4. Lack of one of the characteristics leads to a decrease in photocurrent, or generation of or an increase in a current (dark current) without incident light, resulting in a decrease in S/N ratio. This dark current itself is regarded as noise and includes a fluctuation called shot noise, i.e., quantum noise. Even if such a dark current is removed by the detection unit 12, quantum noise accompanying the dark current cannot be reduced. In general, in order to improve the above characteristics, the conditions for formation of the i-layer 4 and the n-layer 5 and the conditions for annealing after formation of such layers must be optimized. However, the p-layer 3 which is another injection inhibiting layer needs to have the same characteristics as those described above, although the relationship between the electrons and holes is opposite to the above relationship. The respective conditions for the p-layer 3 must also be optimized. In general, the optimal conditions for the former n-layer are not the same as those for the latter p-layer, and it is difficult to satisfy the conditions for both the layers. That is, requiring injection inhibiting layers at two portions in a single optical sensor makes it difficult to form an optical sensor with a high S/N ratio. This applies to the Schottky type sensor in FIG. 20B as well. The Schottky type sensor in FIG. 20B uses a Schottky barrier layer as one injection inhibiting layer. This layer uses the difference in work function between the lower electrode 2 and the i-layer 4. For this reason, materials for the lower electrode 2 are limited, and the localized level of the interface greatly influences the characteristics of the Schottky barrier layer, making it more difficult to satisfy the conditions for the layer. It is also reported that a thin silicon or metal oxide or nitride film having a thickness of about 100 Å is formed between the lower electrode 2 and the i-layer 4 to improve the characteristics of the Schottky barrier layer. This structure uses a tunnel effect to guide holes to the lower electrode 2 and improve the effect of inhibiting injection of electrons into the i-layer 4. The structure also uses the difference in work function, and hence materials for the lower electrode 2 are limited. Furthermore, since the structure uses opposite properties, i.e., inhibition of injection of electrons and movement of holes by means of the tunnel effect, the oxide or nitride film is limited to a very thin film having a thickness of about 100 Å. Moreover, since it is difficult to control thickness and film quality, the productivity decreases.

Requiring injection inhibiting layers at two portions leads to low productivity and high cost for the following reason. These two injection inhibiting layers are important in terms of characteristics. If, therefore, a defect is produced in one of the two layers by dust or the like, characteristics necessary for an optical sensor cannot be obtained.

The second reason will be described with reference to FIG. 21. FIG. 21 shows the layer structure of a field effect transistor (TFT) made of thin semiconductor layers. A TFT is sometimes used as part of a control unit in forming a photoelectric conversion apparatus. The same reference numerals in FIG. 21 denote the same parts as in FIGS. 20A to 20C. This TFT includes a gate insulating film 7 and an upper electrode 60. A method of forming the TFT will be described in orderly sequence. A lower electrode 2 serving as a gate electrode, the gate insulating film 7, an i-layer 4, an n-layer 5, and the upper electrode 60 serving as source and drain electrodes are sequentially formed on an insulating substrate 1. The upper electrode 60 is etched to form source and drain electrodes. Thereafter, the n-layer 5 is etched to form a channel portion. The characteristics of the TFT are easily influenced by the state of the interface between the gate insulating film 7 and the i-layer 4. In general, in order to prevent contamination of the interface, these layers are continuously deposited in the same vacuum.

This layer structure poses a problem in forming a conventional optical sensor on the same substrate on which this TFT is formed, resulting in an increase in cost and a deterioration in characteristics. This is because the layer structures of the conventional sensors in FIGS. 20A and 20B are different from the layer structure of the TFT. More specifically, the PIN type sensor in FIG. 20A has the electrode/p-layer/i-layer/n-layer/electrode structure, and the Schottky type sensor in FIG. 20B has the electrode/i-layer/n-layer/electrode structure. In contrast to this, the TFT has the electrode/insulating layer/i-layer/n-layer/electrode structure. That is, these structures cannot be formed in the same process. A complication of processes results in a decrease in yielding ratio and an increase in cost. In order to share the i-layer/n-layer, an etching process is required for the gate insulating film 7 or the p-layer 3. For this reason, the p-layer 3 as an injection inhibiting layer which is an important layer of the above optical sensor and the i-layer 4 cannot be formed in the same vacuum, or the interface between the gate insulating film 7 which is important to the TFT and the i-layer 4 is contaminated upon etching of the gate insulating film, resulting in a deterioration in characteristics and a decrease in S/N ratio.

The structure, which has an oxide or nitride film formed between the lower electrode 2 and the i-layer 4 to improve the characteristics of the Schottky type sensor in FIG. 20B, is identical to the structure in FIG. 21 in terms of the order of the layers formed. However, as described above, the oxide or nitride film needs to have a thickness of about 100 Å, and hence it is difficult to use it as a gate insulating film.

FIG. 22 shows the result obtained by an experiment on the yielding ratio of TFTs in relation to the gate insulating film. Below a gate insulating film thickness of 1,000 Å, the yielding ratio exhibited an abrupt decrease. At a thickness of 800 Å, the yielding ratio was about 30%. At a thickness of 500 Å, the yielding ratio was 0%. At a thickness of 250 Å, even the operation of the TFT could not be detected. This data clearly shows that it is difficult to use the oxide or nitride film of an optical sensor using a tunnel effect as the gate insulating film of a TFT which needs to insulate electrons and holes.

In addition, although not shown, a capacitive element (to be referred to as a capacitor hereinafter) having good characteristics with a small amount of leakage current, which is an element required to obtain the integral value of charges or currents, is difficult to form with the same structure as that of a conventional optical sensor. Since a capacitor is intended to store charges between two electrodes, a layer for inhibiting movement of electrons and holes is required as an intermediate layer between the electrodes. A conventional optical sensor, however, uses only a semiconductor layer between electrodes. For this reason, it is difficult to obtain an intermediate layer having good characteristics which is thermally stable and has small leakage current.

If a TFT and a capacitor, which are the important elements of a photoelectric conversion apparatus, exhibit poor matching in terms of process and characteristics, many complicated steps are required to form a system having many one- or two-dimensional optical sensors and designed to sequentially detect optical signals. For this reason, the yielding ratio is very low, posing a serious problem in forming a high-performance, multifunctional apparatus at a low cost.

SUMMARY OF THE INVENTION

It is an object of the present invention to provide a photoelectric conversion apparatus having a high S/N ratio and stable characteristics, a driving method therefor, and a system using the apparatus.

It is another object of the present invention to obtain a required image by changing the refresh voltage in accordance with the type of image.

It is still another object of the present invention to switch refresh power supplies in a refresh operation for each photoelectric conversion element by using switches so as to realize a state in which the potential of one electrode is lower than the potential of the other electrode, and a state wherein the potential of one electrode is higher than the potential of the other electrode, thereby realizing both a mode requiring a wide dynamic range in obtaining a motion image or moving image and a mode requiring a reduction in noise in obtaining a still image.

It is still another object of the present invention to provide a photoelectric conversion apparatus allowing a high yielding ratio and having stable characteristics, and a system using the apparatus.

It is still another object of the present invention to provide a photoelectric conversion apparatus which can be formed in the same process as that for a TFT, and can be manufactured at a low cost without complicating the manufacturing process, a driving method for the apparatus, and a system using the apparatus.

In order to achieve the above objects, the present invention has the following means.

The present invention includes mode switching means for performing a refresh operation for a photoelectric conversion element by switching a mode of setting a potential of one electrode of the photoelectric conversion element to be higher than a potential of the other electrode of the element, and a mode of setting the potential of one electrode of the photoelectric conversion element to be lower than the potential of the other electrode of the element.

In addition, the present invention can switch refresh power supplies of different voltages by using switching means.

The present invention is characterized in that the photoelectric conversion apparatus comprises a photoelectric conversion element formed by depositing, on an insulating substrate, a first electrode layer, a first insulating layer for inhibiting passage of carriers of a first type and carriers of a second type having a polarity opposite to that of the carriers of the first type, a photoelectric conversion semiconductor layer, an injection inhibiting layer for inhibiting the carriers of the first type from being injected into the semiconductor layer, and a second electrode layer, refresh mode operation means having a first refresh mode of applying an electric field to each layer to set $$(V_{rG} \cdot q) < (V_D - V_{FB}) \cdot q \quad (1)$$

where $V_{rG}$ is the voltage of the first electrode layer of the photoelectric conversion element, q is the charge of a carrier of the first type, $V_D$ is the voltage of the second electrode layer, and $V_{FB}$ is a threshold voltage, and a second refresh mode of applying an electric field to each layer to set $$(V_{rG} \cdot q) \geq (V_D - V_{FB}) \cdot q \quad (2)$$

and switch means for switching the refresh modes and causing the apparatus to operate in one of the modes.

The present invention is characterized in that a plurality of photoelectric conversion elements each identical to the photoelectric conversion element are one- or two-dimensionally arranged, all the photoelectric conversion elements are divided into a plurality of blocks, and switch elements respectively connected to the photoelectric conversion elements are operated in units of blocks to output optical signals from all the photoelectric conversion elements divided into the plurality of blocks to matrix signal lines.

The present invention is characterized in that each of intersections between the matrix signal lines is constituted by a multilayered structure in which at least a first electrode layer, an insulating layer, a semiconductor layer, and a second electrode layer are sequentially stacked, and the respective layers of the multilayered structure are formed from the same layers as those of a first electrode layer, an insulating layer, a photoelectric conversion semiconductor layer, and a second electrode layer of the photoelectric conversion element, and have the same thicknesses as those of the respective layers of the photoelectric conversion element.

The present invention is characterized in that the apparatus is driven to obtain a desired photoelectric conversion signal by arbitrarily changing a refresh voltage for the photoelectric conversion element.

The present invention is characterized in that switching is performed to set the first refresh mode of applying an electric field to each layer to set $$(V_{rG} \cdot q) < (V_D - V_{FB}) \cdot q \quad (1)$$

when a still image is to be obtained, and switching is performed to set the second refresh mode of applying an electric field to each layer to set $$(V_{rG} \cdot q) \geq (V_D - V_{FB}) \cdot q \quad (2)$$

when a motion image is to be obtained.

The present invention is characterized in that an X-ray image pickup apparatus comprising:

a photoelectric conversion apparatus having a refresh mode;

a phosphor formed on the photoelectric conversion apparatus;

an X-ray source for generating optical information by irradiating X-rays onto the phosphor; and changing means for changing the refresh voltage in accordance with an image.

The present invention further comprises:

a phosphor formed on the photoelectric conversion apparatus;

an X-ray source for generating optical information by irradiating X-rays onto the phosphor;

signal processing means for processing a signal from the photoelectric conversion apparatus;

recording means for recording a signal from the signal processing means;

display means for displaying the signal from the signal processing means; and transmission means for transmitting the signal from the signal processing means.

According to the photoelectric conversion apparatus of the present invention, refresh power supplies can be switched by using switches in a refresh operation for each photoelectric conversion element so as to realize a state in which the potential of one electrode is lower than the potential of the other electrode, and a state wherein the potential of one electrode is higher than the potential of the other electrode, thereby realizing both a mode requiring a wide dynamic range in obtaining a motion image and a mode requiring a reduction in noise in obtaining a still image. In the present invention, a required image can be obtained by changing the refresh voltage in accordance with the type of image.

In addition, according to the present invention, a photoelectric conversion apparatus allowing a high yielding ratio and having stable characteristics, and a system using the apparatus can be provided.

Furthermore, since each photoelectric conversion element of the present invention can be formed in the same process as that for a TFT, each element can be manufactured at a low cost without complicating the manufacturing process.

BRIEF DESCRIPTION OF THE DRAWINGS

FIG. 21 is a schematic sectional view for explaining an arrangement of a TFT; and FIG. 22 is a graph for explaining an example of the relationship between the thickness of the gate insulating film of the TFT and the yielding ratio.

DETAILED DESCRIPTION OF THE PREFERRED EMBODIMENTS

Prior to a description of embodiments of the present invention, the prior art proposed by the present applicants and its refresh operation will be described.

Figure 9A:
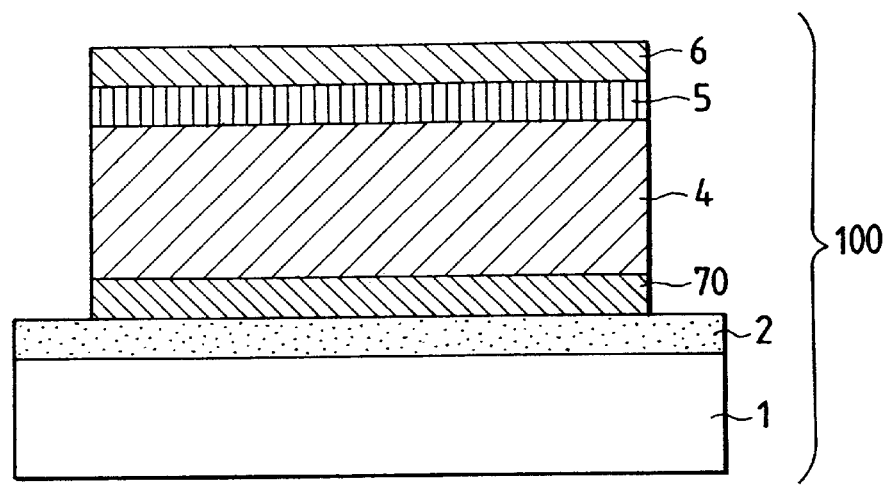
FIGS. 9A and 9B are respectively a schematic sectional view and a schematic circuit diagram for explaining the arrangement of a photoelectric conversion unit previously proposed by the present applicants.
Figure 9B:
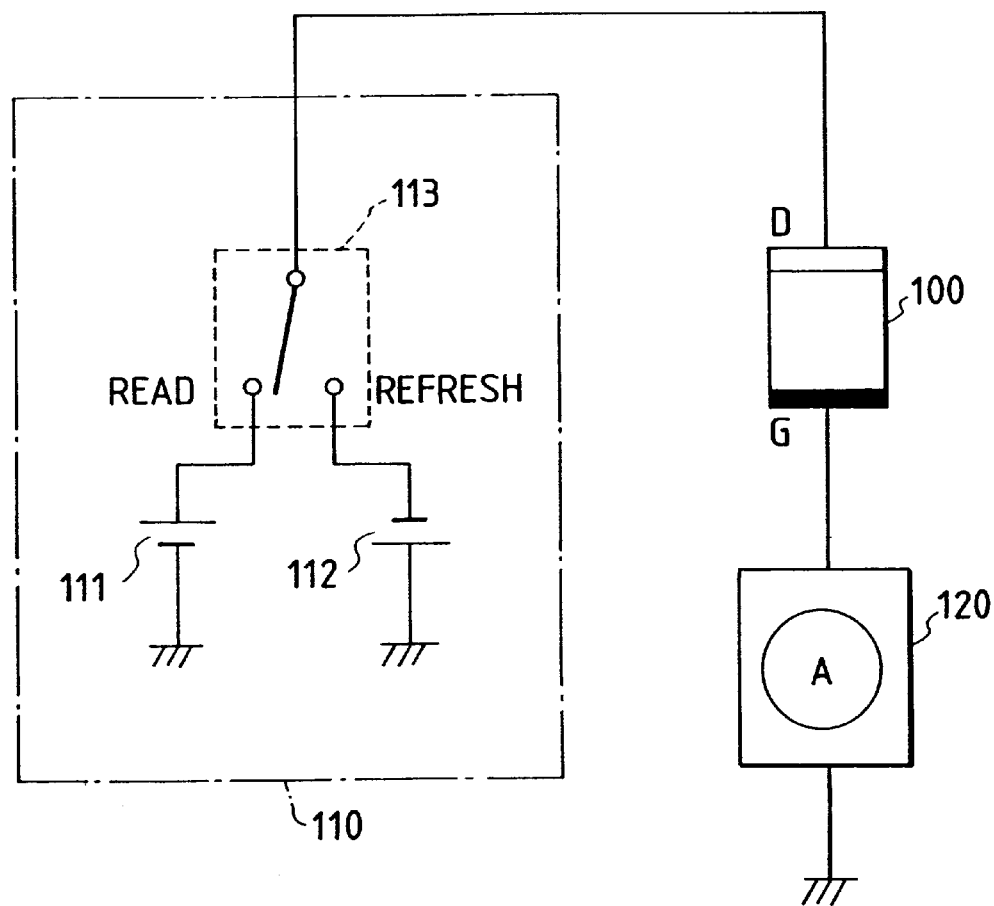

FIGS. 9A and 9B are a sectional view showing the layer structure of a photoelectric conversion element and a schematic circuit diagram showing a photoelectric conversion apparatus, respectively, to explain the photoelectric conversion element of the photoelectric conversion apparatus previously proposed by the present applicants.

Referring to FIG. 9A, this photoelectric conversion element includes an insulating substrate 1 made of a glass material or the like, a lower electrode 2 made of Al or Cr, and an insulating layer 70 made of silicon nitride (SiN) or the like and serving to prevent passage of electrons and holes. The thickness of the insulating layer 70 is set to be 500 Å or more, which is the thickness that inhibits electrons and holes from passing through owing to a tunnel effect. The photoelectric conversion element also includes an intrinsic semiconductor layer (i-layer) 4 made of hydrogenated amorphous silicon (a-Si:H), and an injection inhibiting layer 5 consisting of an a-Si n$^+$-layer and serving to inhibit holes from being injected from a transparent electrode 6 into the photoelectric conversion semiconductor layer 4. The transparent electrode 6 is made of a compound such as ITO containing indium and tin, an oxide, or the like.

Referring to FIG. 9B, the photoelectric conversion apparatus includes a photoelectric conversion element 100 in which "D" indicates an electrode on the transparent electrode 6 side, and "G" indicates an electrode on the lower electrode 2 side, a detection unit 120, and a power supply unit 110. The power supply unit 110 includes a switch 113 for switching a positive power supply 111 and a negative power supply 112. The positive power supply 111 applies a positive potential to the D electrode. The negative power supply 112 applies a negative potential to the D electrode. The switch 113 is controlled to be connected to the refresh side in the refresh mode, and to the read side in the photoelectric conversion mode.

The operation of the photoelectric conversion element 100 will be described below.

Figure 10A:
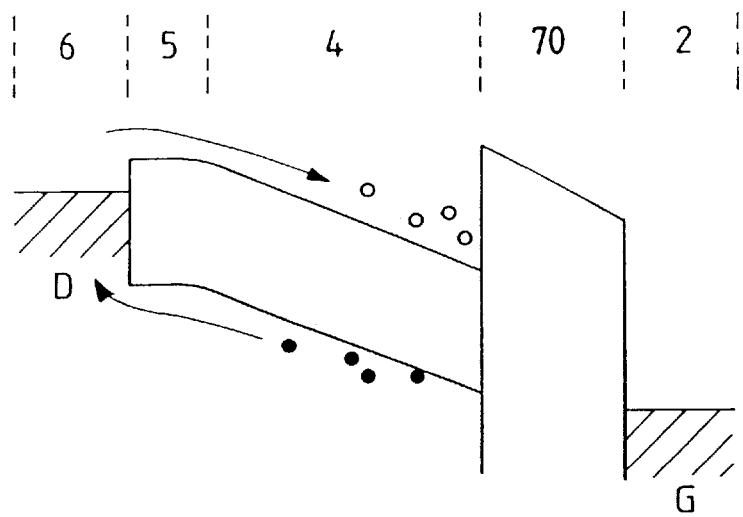
FIGS. 10A to 10C are energy band diagrams for explaining the energy state of the photoelectric conversion unit.
Figure 10B:
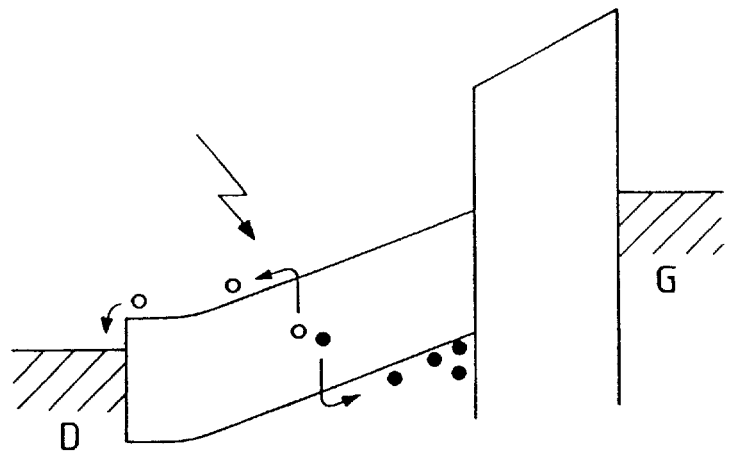

FIGS. 10A and 10B show energy band diagrams of a photoelectric conversion unit when the photoelectric conversion element 100 is set in the refresh mode and the photoelectric conversion mode, respectively. More specifically, FIGS. 10A and 10B show the states of the respective layers of the photoelectric conversion element in the direction of thickness.

In the refresh mode shown in FIG. 10A, since a negative potential is applied to the D electrode in relation to the G electrode, the holes indicated by the full circles in the i-layer 4 are guided to the D electrode. At the same time, the electrons indicated by the open circles are injected into the i-layer 4. At this time, some holes and electrons re-combine with each other in the n-layer 5 and the i-layer 4 to disappear. If this state continues for a sufficiently long period of time, the holes in the i-layer 4 are discharged therefrom (FIG. 10A).

When the photoelectric conversion mode shown in FIG. 10B is set in this state, since a positive potential is applied to the D electrode in relation to the G electrode, the electrons in the i-layer 4 are instantly guided to the D electrode. However, no holes are guided to the i-layer 4 because the n-layer 5 serves as an injection inhibiting layer. When light is incident on the i-layer 4 in this state, the light is absorbed to generate electron-hole pairs. The electrons are guided to the D electrode, whereas the holes move in the i-layer 4 and reach the interface between the i-layer 4 and the insulating layer 70. Since the holes cannot move into the insulating layer 70, the holes stay in the i-layer 4. At this time, the electrons move to the D electrode, and the holes move to the interface between the i-layer 4 and the insulating layer 70. A current therefore flows from the G electrode to the detection unit 120 to maintain the electrical neutrality in the element. This current corresponds to the electron-hole pairs generated by the light, and hence is proportional to the incident light (FIG. 10B).

When the refresh mode shown in FIG. 10A is set again after a certain period of time during which the photoelectric conversion mode shown in FIG. 10B is maintained, the holes remaining in the i-layer 4 are guided to the D electrode, as described above. At the same time, charges corresponding to these holes flow in the detection unit 120. The quantity of holes corresponds to the total amount of incident light in the photoelectric conversion mode interval. The charges flowing in the detection unit 120 correspond to the total amount of light. Although charges correspond to the quantity of electrons injected into the i-layer 4 also flow, the quantity of charges is almost constant. It suffices therefore if this quantity of charges is subtracted from the total quantity of detected charges.

That is, the photoelectric conversion element 100 can output the total amount of incident light in a given interval, as well as the amount of incident light in real time. This is a major characteristic feature of the structure previously proposed by the present applicants. The detection unit 120 may detect one or both of the above amounts in accordance with the intended application.

The operation of the photoelectric conversion apparatus previously proposed by the present applicants will be described below with reference to FIG. 11.

Figure 11:
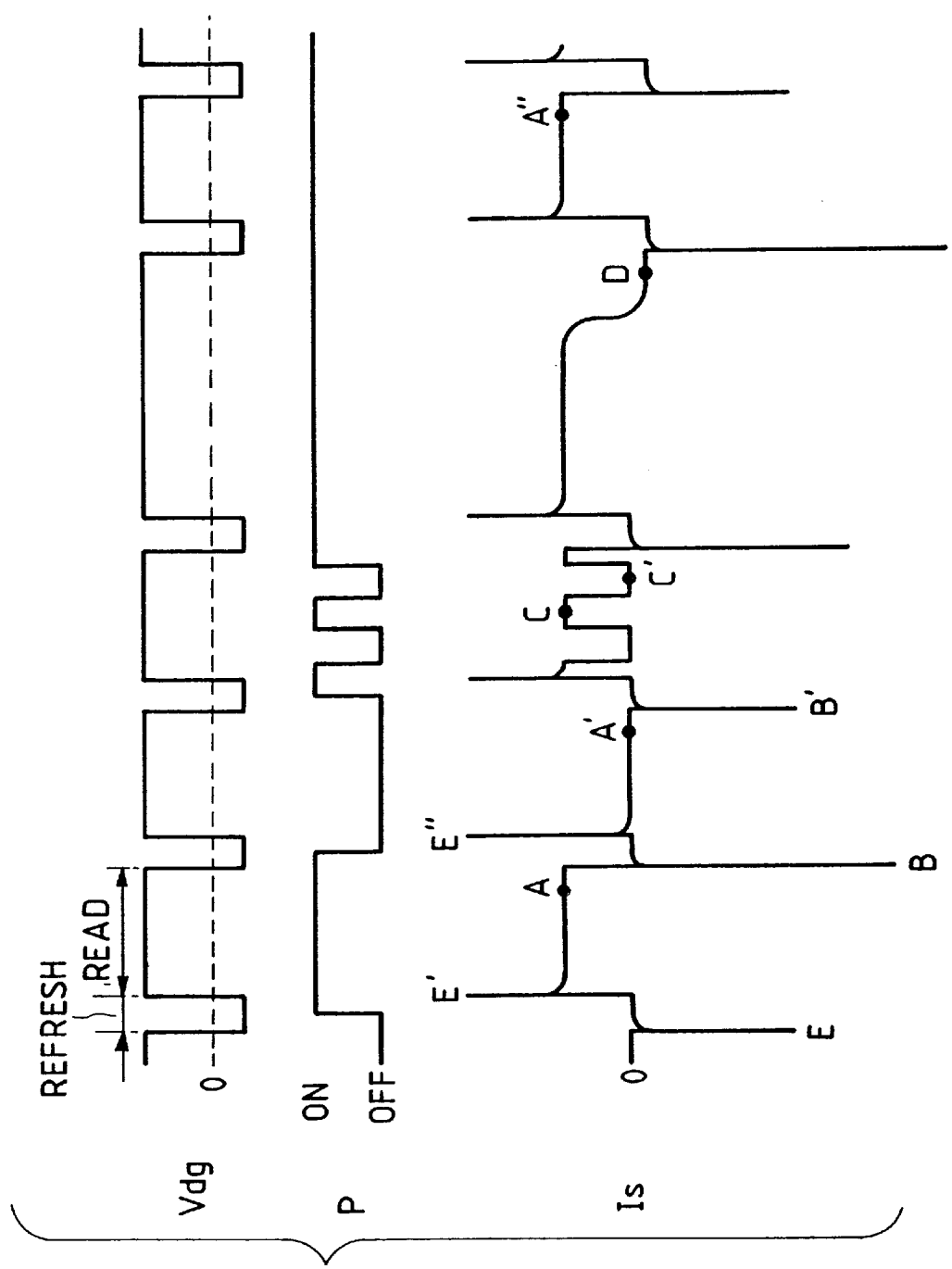
FIG. 11 is a timing chart for explaining a photoelectric conversion apparatus previously proposed by the present applicants.

FIG. 11 is a timing chart showing the operation of the photoelectric conversion apparatus in FIGS. 9A and 9B. Referring to FIG. 11, a potential $V_{dg}$ is the potential of the D electrode in relation to the G electrode of the photoelectric conversion element 100. In an incident state P, "ON" indicates a state in which light is incident, and "OFF" indicates a state in which no light is incident, i.e., a dark state. A current is is a current flowing into the detection unit 120. The direction of the abscissa in FIG. 11 indicates the lapse of time.

When the switch 113 is connected to the refresh side, the refresh mode starts, and the potential $V_{dg}$ becomes a negative voltage. As a result, holes are discharged, as shown in FIG. 10A. As electrons are injected into the i-layer 4, a negative inrush current E flows in the detection unit 120, as shown in FIG. 11. When the refresh mode is completed, and the switch 113 is connected to the read side, the electrons in the i-layer 4 are discharged, and a positive inrush current E' flows. As a result, the photoelectric conversion mode is set. If light is incident on the photoelectric conversion element 100, a photocurrent A flows. If a dark state is set in a similar operation, no current flows, as indicated by "A'" in FIG. 11. If, therefore, the photocurrent A is integrated directly or for a predetermined period of time, the incidence of light can be detected.

When the switch 113 is connected to the refresh side in the state indicated by "A", an inrush current B flows. The amount of this current is reflected in the total amount of incident light in the immediately preceding photoelectric conversion mode interval, so the integral or the like of the inrush current B need only be obtained. If no light is incident in the immediately preceding photoelectric conversion mode, a small inrush current B' flows. The incidence of light can be detected by detecting the difference between the above inrush currents. In addition, since the above inrush current E' or E" is almost equal to the inrush current B', these inrush currents may be subtracted from the inrush current B.

Even in the same photoelectric conversion mode interval, the current Is changes as indicated by "C" and "C'" in FIG. 11, if the incident state of light changes. The incident state of light can also be detected by detecting this change. That is, the refresh mode need not always be set for each detecting operation.

Figure 10C:
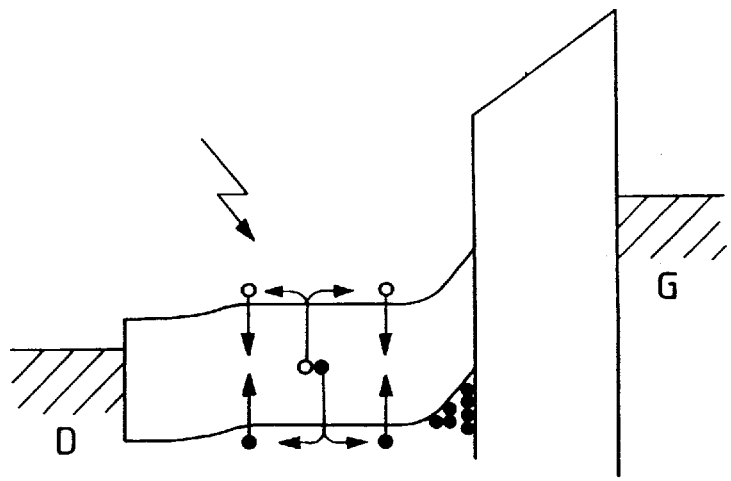

If the photoelectric conversion mode interval is prolonged or the illuminance of incident light is high for some reason, no current may flow in spite of incidence of light, as indicated by "D" in FIG. 11. Such a phenomenon occurs for the following reason. As shown in FIG. 10C, many holes stay in the i-layer 4, and the electric field in the i-layer 4 is reduced because of these holes. As a result, generated electrons are not guided to the D electrode but re-combine with the holes. If the incident state of light changes in this state, a current may flow unstably. If, however, the refresh mode is set again, the holes in the i-layer 4 are discharged, and a current A" equal to the current A can be obtained in the next photoelectric conversion mode.

In the above description, incident light is assumed to be constant in intensity. As is apparent, however, all the currents A, B, and C continuously change in accordance with the intensity of incident light, and hence the intensity of incident light can be quantitatively detected as well as the presence/absence of incident light.

In addition, in the above description, when holes in the i-layer 4 are to be discharged in the refresh mode, all the holes are ideally discharged. Even if, the holes are partly discharged, the same effect as described above can be obtained. That is, the value obtained in this case is the same as that obtained when all the holes are discharged to obtain the photocurrent A or C. Furthermore, if holes are discharged such that a constant quantity of holes are always left, the amount of light can be quantitatively detected with the current B. That is, the voltage $V_{dg}$ in the refresh mode, the refresh mode interval, and the characteristics of the n-layer 5 as the injection inhibiting layer may be determined so as not to set the current value in the state indicated by "D", i.e., the state shown in FIG. 10C, in performing a detecting operation in the next photoelectric conversion mode.

In the refresh mode, injection of electrons into the i-layer 4 is not a necessary condition, and the voltage $V_{dg}$ is not limited to a negative voltage. It suffices if the holes in the i-layer 4 are partly discharged. When many holes stay in the i-layer 4, even if the voltage $V_{dg}$ is a positive voltage, the electric field in the i-layer 4 acts in a direction to guide holes to the D electrode. Similarly, injection of electrons into the i-layer 4 is not a necessary condition in terms of the characteristics of the n-layer 5 as the injection inhibiting layer.

FIGS. 12A to 12D show examples of the detection unit. These examples include an ammeter 121 typified by a current amplifier, a voltmeter 122, a resistor 123, a capacitor 124, a switch element 125, and an operational amplifier 126.

Figure 12A:
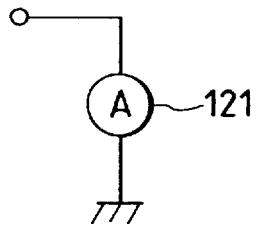
FIGS. 12A to 12D are schematic circuit diagrams for explaining examples of the arrangement of a detection unit.
Figure 12B:
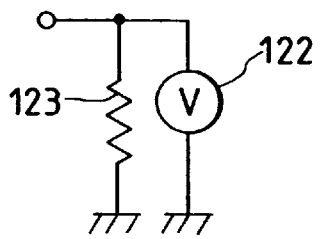
Figure 12C:
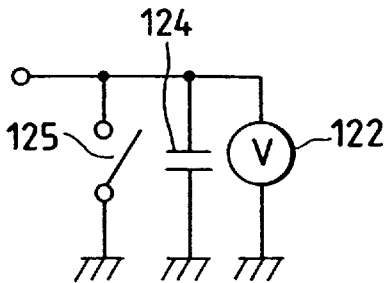
Figure 12D:
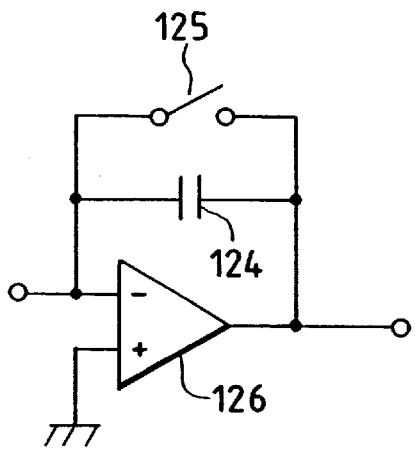

FIG. 12A shows an arrangement for directly detecting a current. The output from the ammeter 121 is a voltage or an amplified current. Referring to FIG. 12B, a current is flowed in the resistor 123, and a voltage is detected by the voltmeter 122. Referring to FIG. 12C, charges are stored in the capacitor 124, and a voltage is detected by the voltmeter 122. Referring to FIG. 12D, the integral of a current is detected as a voltage by the operational amplifier 126. Referring to FIGS. 12C and 12D, the switch element 125 serves to give an initial value for each detecting operation, and can be replaced with a resistor having a high resistance depending on the detection method involved.

An ammeter and a voltmeter can be constituted by transistors, operational amplifiers combining such transistors, resistors, capacitors, and the like. A high-speed element can be used as an ammeter or voltmeter. The detection unit is not limited to these four types. Any unit capable of directly detecting a current or charge or the integral thereof can be used. Detectors for detecting currents or voltages, resistors, capacitors, and switch elements may be combined to constitute a plurality of photoelectric conversion units designed to output simultaneously or sequentially.

When a line sensor or an area sensor is to be formed, the lines and switch elements of power supply units are arranged in the form of a matrix to control or detect the potentials of 1,000 or more photoelectric conversion units. In this case, if the switching elements, the capacitors, and the resistors are partly arranged on the same substrate on which the photoelectric conversion units are formed, the resultant structure is advantageous in terms of S/N ratio and cost. In this case, since a photoelectric conversion unit previously proposed as an example by the present applicants has the same layer structure as that of a TFT which is a typical switch element, the unit can be formed in the same process. Therefore, a photoelectric conversion apparatus with a high S/N ratio can be realized at a low cost.

The characteristics of a photoelectric conversion apparatus differ depending on the refresh voltage value in the refresh mode. Such a difference will be described next with reference to a photoelectric conversion apparatus previously proposed by the present applicants.

Figure 13:
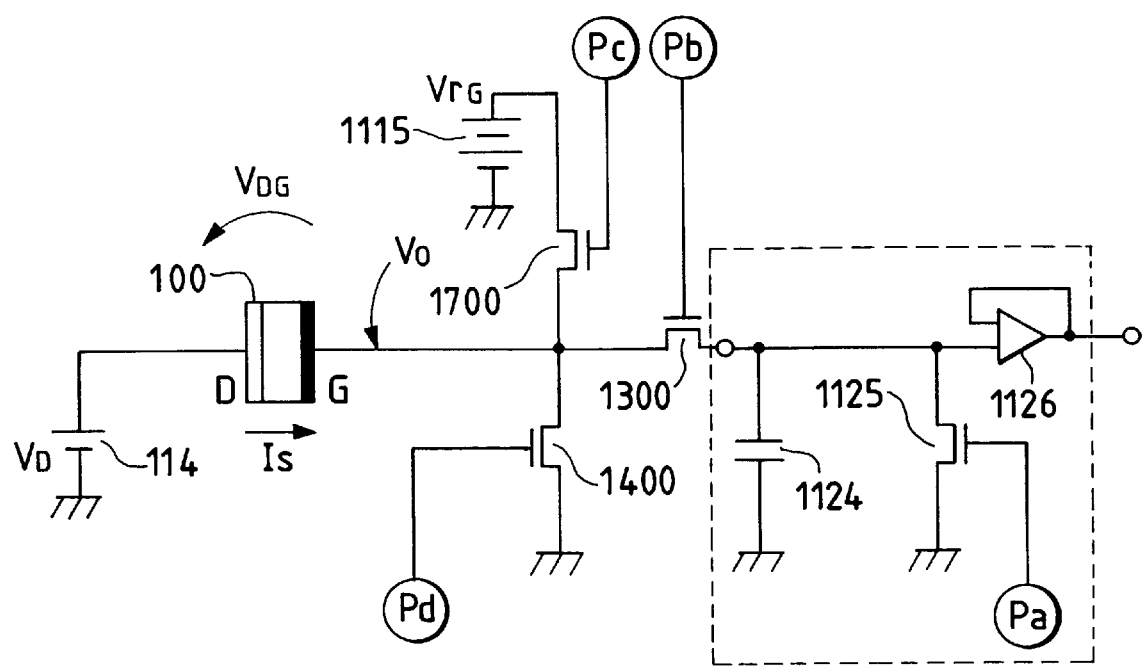
FIG. 13 is a schematic circuit diagram for explaining a photoelectric conversion apparatus of the present invention.
Figure 14:
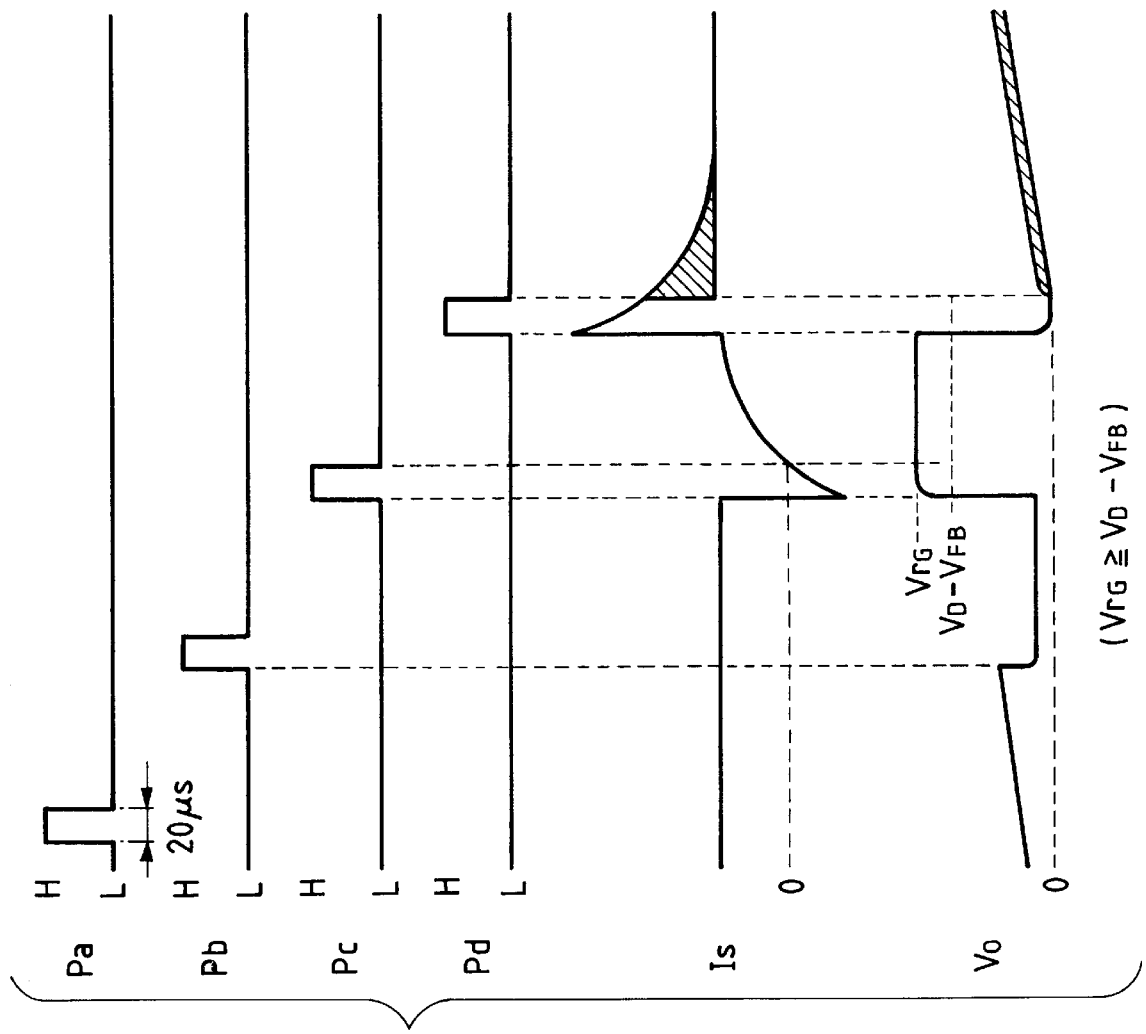
FIG. 14 is a timing chart for explaining the operation of the photoelectric conversion apparatus.

FIG. 13 is an equivalent circuit diagram of a one-bit portion of a photoelectric conversion apparatus constituted by a TFT 1700 and a power supply 1115. FIG. 14 is a timing chart showing the operation of the apparatus.

The operation of the photoelectric conversion apparatus will be described below with reference to FIG. 13 which is an equivalent circuit diagram of a one-bit portion of the photoelectric conversion apparatus, in which a positive potential is applied to the G electrode of a photoelectric conversion element through the TFT 1700. Assume that the potential of the D electrode of the photoelectric conversion element is set to $V_D$ by a power supply 114, and the potential of the G electrode in the refresh operation is set to $V_{rG}$ by the power supply 1115.

A case in which the potential ($V_0$) of the G electrode of the photoelectric conversion element 100 is refreshed to be equal to or higher than the potential ($V_D$) of the D electrode ($V_0=V_{rG} \geq V_D$), as shown in FIG. 9, will be described below. When the potential of the G electrode is refreshed to this state, electrons are trapped in holes remaining in the i-layer 4 of the photoelectric conversion element 100 and interface defects present on the interface between the i-layer 4 and the insulating layer 70. This current will be referred to as a negative inrush current hereinafter. When the potential of the G electrode of the photoelectric conversion element 100 is initialized to the GND potential or the like after the refresh operation, all the electrons trapped in the i-layer 4 and the interface defects are discharged to the D electrode. This current will be referred to as a positive inrush current hereinafter. Since the energy levels of the interface defects present on the interface between the i-layer 4 and the insulating layer 70 are generally high, energy required to move electrons and holes from and to the interface defects is relatively high, and the apparent mobility is low. For this reason, it takes several ten microseconds to several seconds until the positive inrush current becomes zero, i.e., all the electrons trapped in the interface defects are discharged to the D electrode. A large inrush current therefore flows even after the reset operation of the G electrode. As a result, the charges stored in the capacitor of the G electrode include charges as noise components which are generated by the inrush current. Consequently, the S/N ratio decreases in accordance with the charges as the noise components.

The reasons for the above phenomenon will be described in detail with reference to FIGS. 13 and 14.

Referring to FIG. 13, "Pa", "Pb", "Pc", and "Pd" respectively indicate the timings of pulses for driving a switch element 1125, a transfer TFT 1300, the refresh TFT 1700, and a reset TFT 1400 in FIG. 13. Referring to FIG. 14, "H" indicates high level at which each driving element is set in the ON state. In general, for high level, +5 V to +12 V is used for a crystalline silicon semiconductor switch element, and +8 V to +15 V is used for an a-Si TFT. In addition, 0 V is often used as L (low level). As indicated by the arrows in FIG. 13, while constant signal light is irradiated on each photoelectric conversion element 100, a current $I_s$ flows in the direction indicated by the arrow, and the G electrode has a potential $V_0$. FIG. 14 shows the current $I_s$ and the potential $V_0$ in an operation with the pulse width of each of pulses Pa to Pd being set to 20 μs.

Referring to FIG. 14, the potential $V_0$ is kept at a constant high potential in the interval between the leading edge of the refresh pulse Pc and the leading edge of the reset pulse Pd. No positive inrush current is therefore generated in this interval. At the leading edge of the pulse Pd, a positive inrush current is generated for the first time, which is assumed to be generated owing to discharging of electrons trapped in interface defects. In the apparatus manufactured by the present applicants, it takes about 80 to 100 μs until this positive inrush current is attenuated to almost zero. For this reason, a positive inrush current is generated in quantity at the trailing edge of the pulse Pd at which the capacitor of the G electrode starts to store signal charges. As a result, charges and a voltage value corresponding to the hatched portion in FIG. 14 are stored as noise components. Consequently, the S/N ratio decreases in accordance with the stored noise components. A positive inrush current may be reduced by prolonging the duration of the initialization pulse Pd. However, the duration has its own limit. In addition, as the duration is prolonged, the signal read time of the overall apparatus is prolonged, resulting in a decrease in the processing speed of the apparatus, i.e., a deterioration in the performance of the apparatus.

Figure 15A:
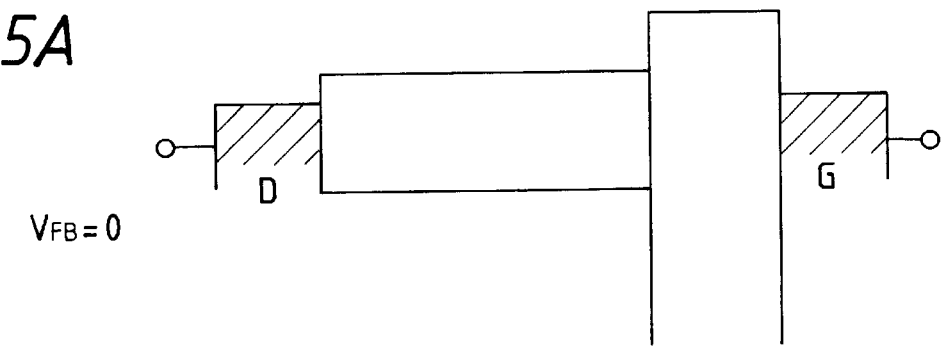
FIGS. 15A to 15C are energy band diagrams for explaining the energy state of a photoelectric conversion unit.
Figure 15B:
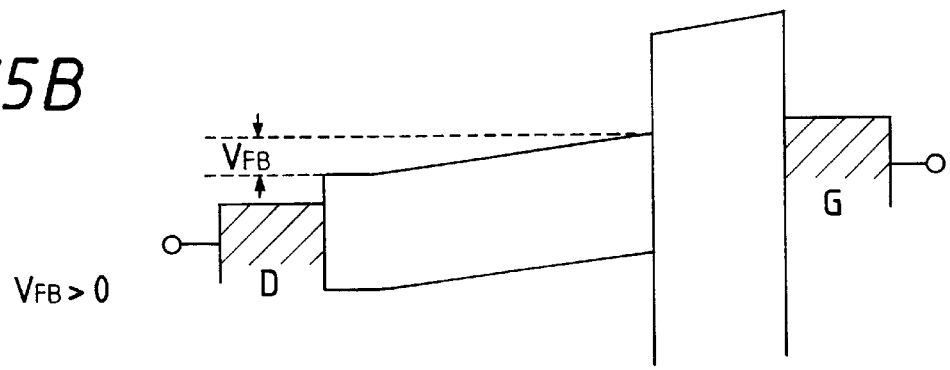
Figure 15C:
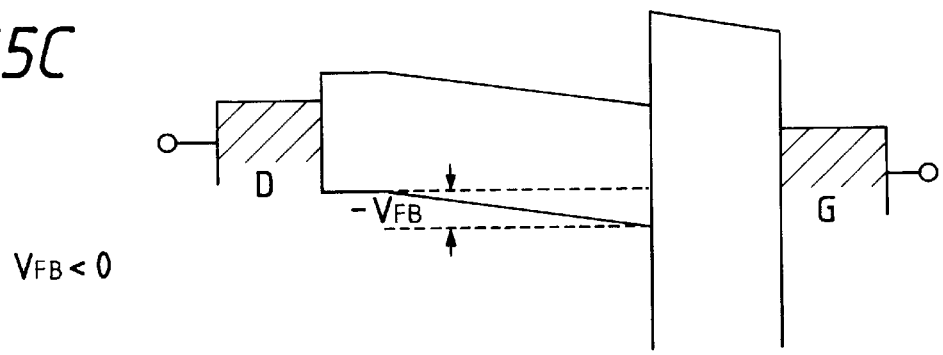

The applied voltages as conditions for refreshing the photoelectric conversion element 100 will be described next with reference to FIGS. 15A to 15C. FIGS. 15A to 15C are energy band diagrams of the photoelectric conversion element 100, in which the electrodes (D and G electrodes) on the two ends are in the open state. The photoelectric conversion element 100 has a so-called MIS (Metal-Insulator-Semiconductor) structure, and exhibits a state in which the total capacitance is small (depletion state) and a state in which the total capacitance is large (accumulation state) depending on the voltage applied between the two electrodes.

The two ends of each of the apparatuses shown in FIGS. 15A to 15C are set in the open state. The energy band diagram in FIG. 15B corresponds to the energy band diagram in the above depletion state. The energy band diagram in FIG. 15C corresponds to the energy band diagram in the above accumulation state.

In general, an MIS capacitor tends to exhibit the state in FIG. 15A, i.e., the state in which the band of the i-layer is flat (flat band voltage $V_{FB}=0$ V) or the state in FIG. 15B, i.e., the slightly depletion state (3 V $\geq V_{FB} > 0$ V) immediately after the capacitor is manufactured. In addition, the voltage $V_{FB}$ can be set to an arbitrary positive or negative value to a certain extent by applying a voltage between the two ends of the MIS capacitor.

The voltage values as conditions which cause positive inrush currents (each having a long attenuation time and a large current value) will be summarized below.

Assume that the flat band voltage $V_{FB}$ of the i-layer of the photoelectric conversion element 100 is zero. In this case, if the potential ($V_{rG}$) of the G electrode in the refresh operation is higher than the potential ($V_D$) of the D electrode, i.e., $V_{rG} > V_D$, the above positive inrush current flows.

Assume that the flat band voltage $V_{FB}$ of the i-layer of the photoelectric conversion element 100 is not zero. In this case, if the potential ($V_{rG}$) of the G electrode in the refresh operation is higher than a voltage value obtained by subtracting the voltage $V_{FB}$ from the potential ($V_D$) of the D electrode, i.e., $V_{rG} \geq V_D - V_{FB}$, the above inrush current flows.

The above mechanism will be described with reference to FIGS. 16A to 16C.

Figure 16A:
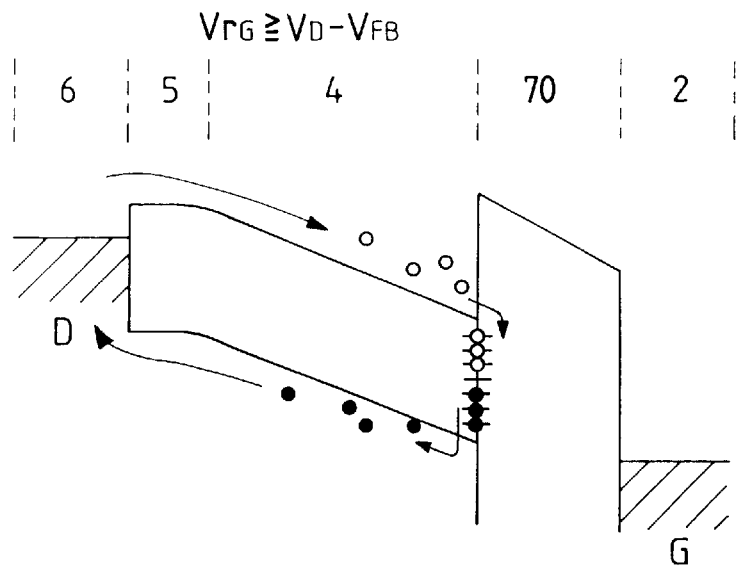
FIGS. 16A to 16C are energy band diagrams for explaining the energy state of the photoelectric conversion unit.
Figure 16B:
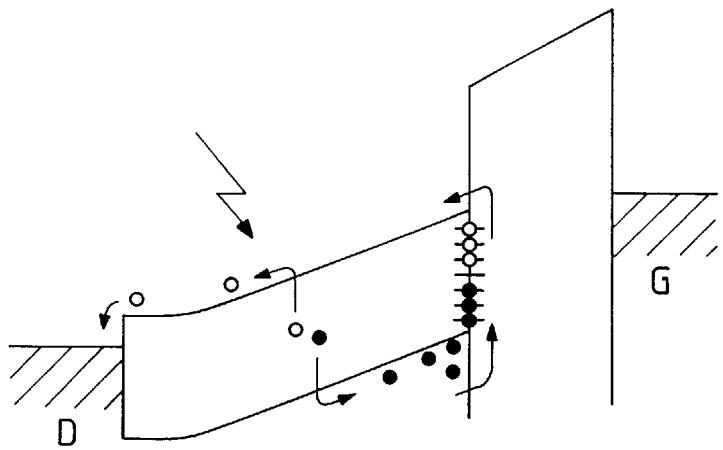
Figure 16C:
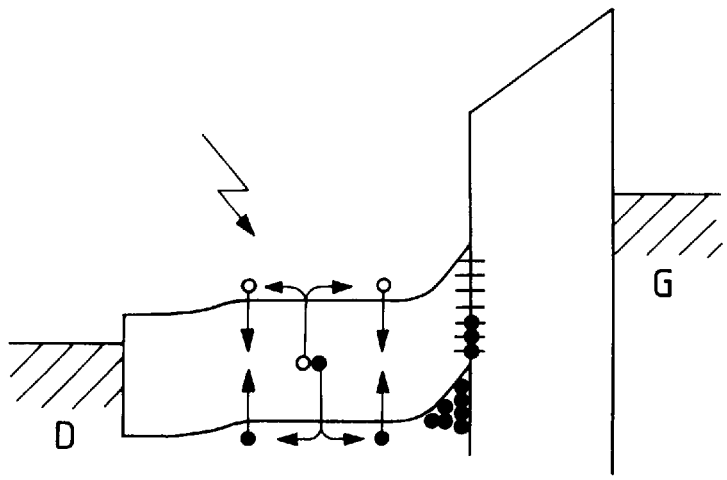

Each of FIGS. 16A to 16C is an energy band diagram of the photoelectric conversion element 100 in a case in which $V_{rG} \geq V_D - V_{FB}$, more specifically, the states of layers 2 to 6 in FIG. 16A in the direction of thickness. In the refresh mode in FIG. 16A, since a negative potential is applied to the D electrode in relation to the G electrode, the holes in the i-layer 4 which are indicated by the full circles are guided to the D electrode by an electric field. At the same time, the electrons indicated by the open circles are injected into the i-layer 4. In addition, the holes trapped in interface defects between the i-layer 4 and the insulating layer 70 are guided to the D electrode with the lapse of a certain period of time. In contrast to this, some of the electrons trapped in the i-layer 4 are trapped in the interface defects between the i-layer 4 and the insulating layer 70 with the lapse of a certain period of time. At this time, some holes and some electrons re-combine with each other in the n-layer 5 and the i-layer 4 and disappear. If this state continues for a sufficiently long period of time, the holes in the i-layer 4 are discharged therefrom. When the photoelectric conversion mode in FIG. 16B is set in this state, since a positive potential is applied to the D electrode in relation to the G electrode, the electrons in the i-layer 4 are immediately guided to the D electrode. The electrons trapped in the interface defects between the i-layer 4 and the insulating layer 70 are guided to the D electrode with the lapse of a certain period of time. The electrons trapped in the interface defects cause the above inrush current. In this case, since the n-layer 5 serves as an injection inhibiting layer, no holes are guided to the i-layer 4. When light is incident on the i-layer 4 in this state, the light is absorbed, and electron-hole pairs are generated. The electrons are guided to the D electrode by an electric field, and the holes move in the i-layer 4 and reach the interface between the i-layer 4 and the insulating layer 70. However, the holes cannot move into the insulating layer 70, and they stay in the i-layer 4. FIG. 16C shows a state after the photoelectric conversion mode in FIG. 16B is maintained for a certain period of time.

The dynamic range (D·R) of the photoelectric conversion element 100 under these refresh conditions will be described next. The dynamic range (D·R) of the photoelectric conversion element 100 in FIG. 13 is expressed as a charge quantity by $D·R = V_{rG} \times C_S$, where $C_S$ is the capacitance of the photoelectric conversion element 100. The dynamic range (D·R) of the photoelectric conversion element 100 therefore increases with an increase in the refresh voltage $V_{rG}$. For this reason, when a large amount of signal light is irradiated on the photoelectric conversion element 100, since a large signal amount based on the light can be obtained, the S/N ratio increases.

A case in which the photoelectric conversion element 100 is refreshed to a potential equal to or lower than the potential ($V_0$) of the G electrode ($V_{rG} < V_D - V_{FB}$) will be described next.

Figure 17:
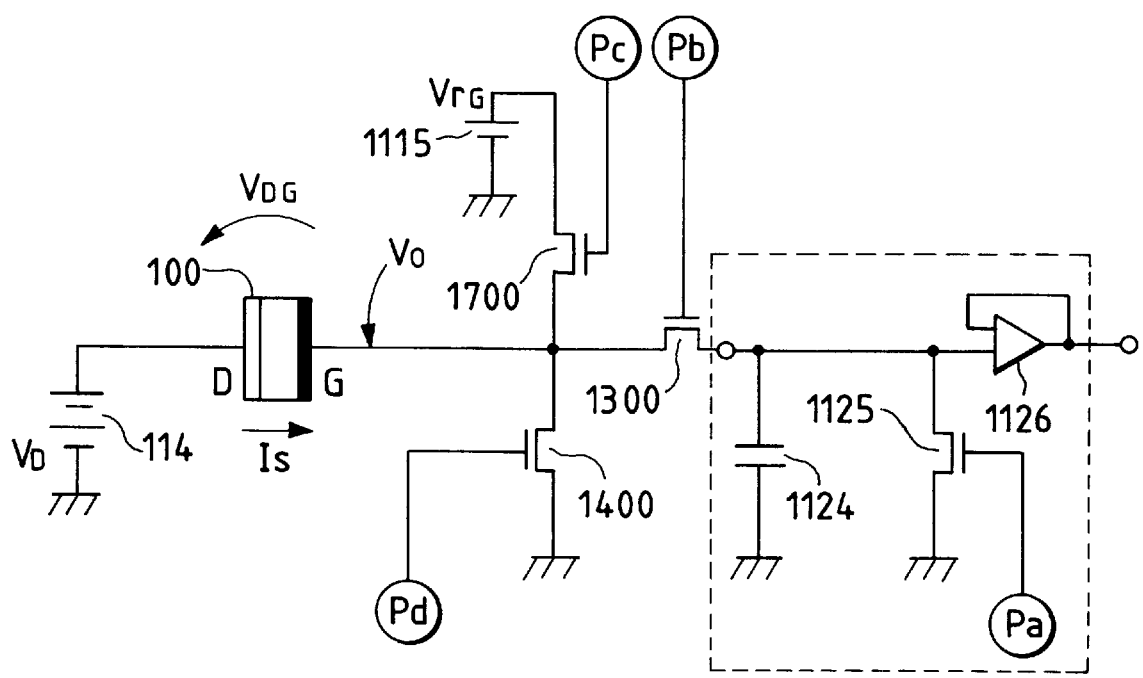
FIG. 17 is a schematic circuit diagram for explaining a photoelectric conversion apparatus.
Figure 18:
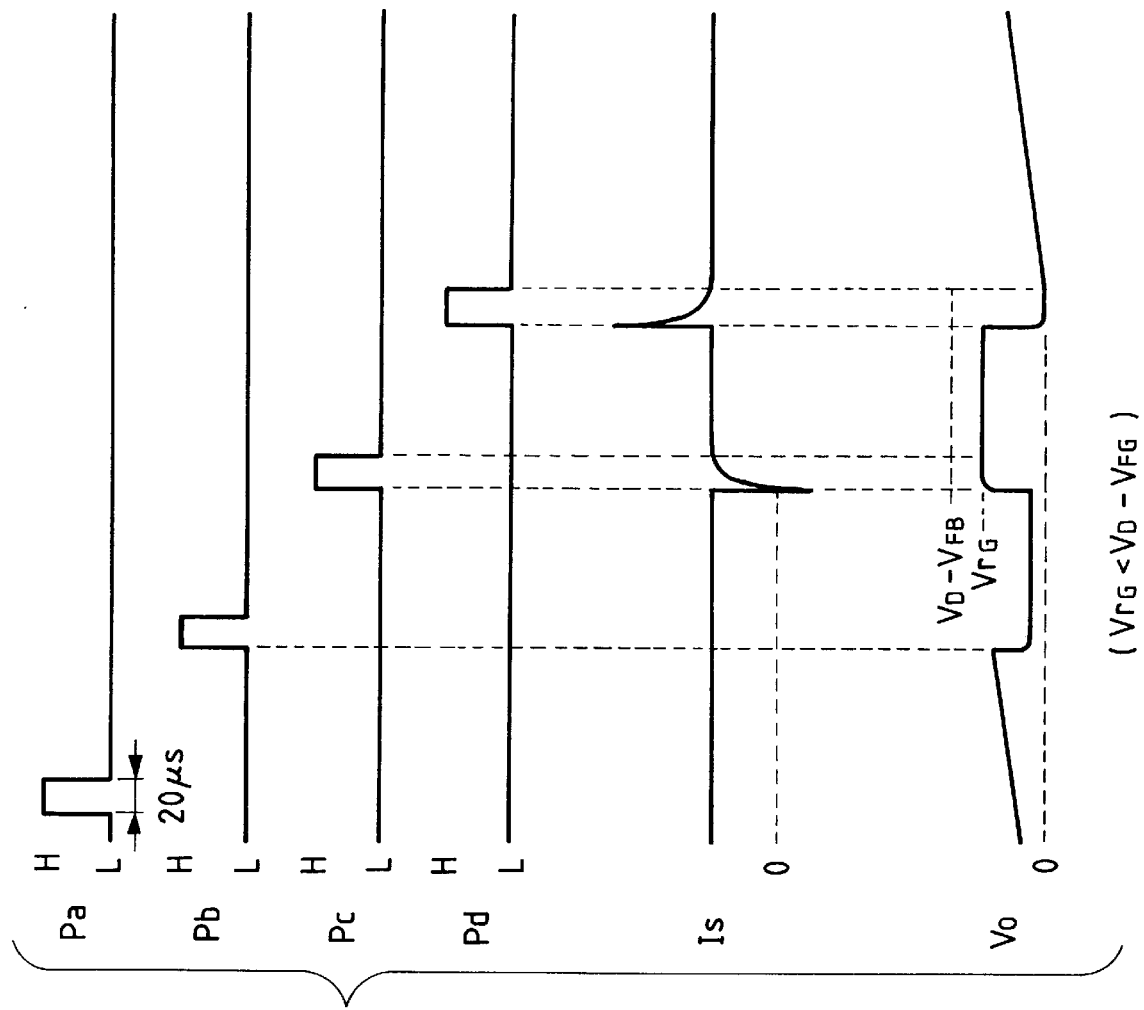
FIG. 18 is a timing chart for explaining the operation of the photoelectric conversion apparatus.

FIG. 17 is a schematic equivalent circuit diagram of a one-bit portion of a photoelectric conversion apparatus. FIG. 18 is a timing chart in a case in which the photoelectric conversion apparatus in FIG. 17 is actually driven.

The same reference numerals in FIG. 17 denote the same parts as in FIG. 13, and hence a description thereof will be omitted. The schematic equivalent circuit diagram in FIG. 13 is different from that in FIG. 17 in the size of a power supply connected to the TFT 1700. Since a photoelectric conversion element 100 has the same structure as that shown in FIG. 9A, an n-type layer is formed as an injection inhibiting layer between the i-layer and the second electrode layer, and carriers to be inhibited from being injected are holes. If, therefore, the charge of one carrier to be inhibited from being injected is represented by q, q>0.

Note that the signal detection unit in FIG. 17 includes the detection means enclosed within the dotted line in FIG. 17, a TFT 1300, and a means for applying a high-level pulse Pb.

The arrangement in FIG. 17 is different from that in FIG. 13 only in that a potential $V_{rG}$ of a power supply 1115 for applying a positive potential to the G electrode in the refresh operation for a photoelectric conversion element 100 is set to be lower than a potential $V_D$ of a power supply 114 for applying a positive potential to the D electrode. More specifically, since a flat band voltage ($V_{FB}$) to be applied to the G electrode to make the energy band of the i-layer flat is present in the photoelectric conversion element 100, the apparatus is driven in the state of $V_{rG} < V_D - V_{FB}$ in FIG. 17, unlike the case shown in FIG. 13, in which the apparatus is driven in the state of $V_{rG} \geq V_D - V_{FB}$.

The operation of the photoelectric conversion apparatus in the state of $V_{rG} < V_D - V_{FB}$ will be described next with reference to FIG. 18.

The operation shown in FIG. 18 is different from that shown in FIG. 14 in the behaviors of a current $I_s$ in the photoelectric conversion element 100 and the potential $V_0$ of the G electrode which is based on the current $I_s$.

Referring to FIG. 18, when a refresh pulse Pc rises, and the voltage $V_{rG}$ ($V_{rG} < V_D - V_{FB}$) is applied to the G electrode of the photoelectric conversion element 100, some of the holes remaining in the i-layer of the photoelectric conversion element 100 are discharged to the D electrode. It is assumed that almost all the holes trapped in the interface defects between the i-layer and the insulating layer remain in the same state at this time. At this time, electrons flow from the D electrode into the i-layer in a quantity equal to or smaller than the quantity of holes discharged to the D electrode. However, since the potential of the i-layer is lower on the G electrode, it is also taken for granted that almost no holes are trapped in the interface defects between the i-layer and the insulating layer. For this reason, the current $I_s$ in FIG. 18 generates only a small negative inrush current at the leading edge of the refresh pulse Pc, and has a short attenuation time. In addition, the potential $V_0$ of the G electrode is kept almost equal to $V_{rG}$ in the interval between the leading edge of the refresh pulse Pc and the leading edge of a G electrode reset pulse Pd. FIG. 18 shows that the potential of the G electrode is lower than $V_D - V_{FB}$.

Subsequently, when the G electrode reset pulse rises, and the G electrode of the photoelectric conversion element 100 is grounded to GND, all the few electrons left in the i-layer flow to the D electrode. Since there are no electrons in the interface defects between the i-layer and the insulating layer at this time, it is taken for granted that only a small quantity of electrons flow instantly. In addition, it is surmised that the holes present in the interface defects hardly move at this time. For this reason, the current $I_s$ generates only a small positive inrush current at the leading edge of the G electrode reset pulse Pd, and has a short attenuation time. If the interval between the leading edge and trailing edge of the G electrode reset pulse Pd is set to be about 20 μs, almost no inrush current flows at the trailing edge of the pulse Pd at which a photoelectric conversion operation is started, as shown in FIG. 18. For this reason, almost all the charges stored from the trailing edge of the pulse Pd become charges based on signal light incident on the photoelectric conversion element 100. By reading this signal voltage, information with a high S/N ratio can be obtained.

A basic mechanism in the structure previously proposed by the present applicants will be described further below.

Figure 19A:
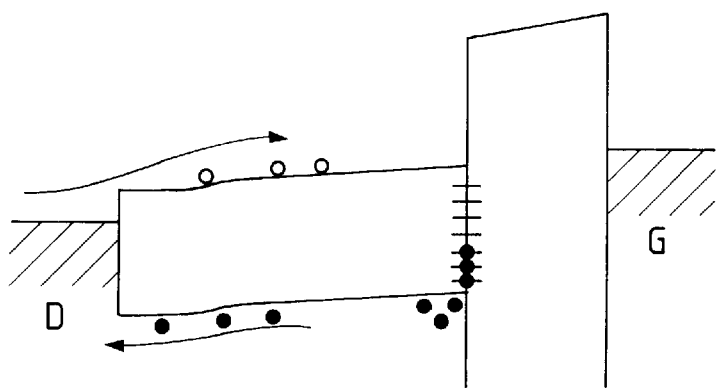
FIGS. 19A to 19C are energy band diagrams for explaining the energy state of a photoelectric conversion unit.
Figure 19B:
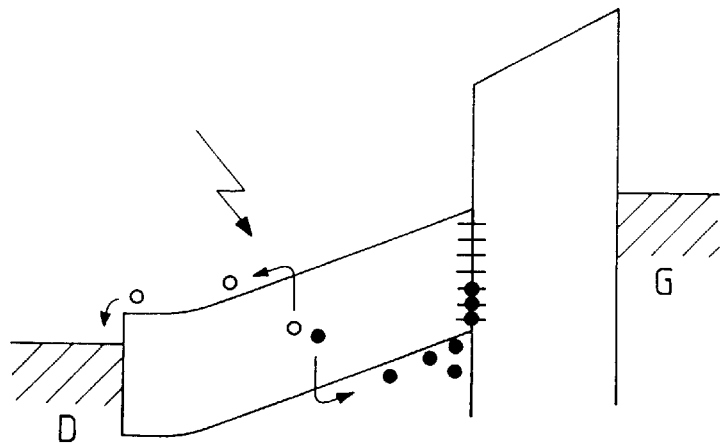
Figure 19C:
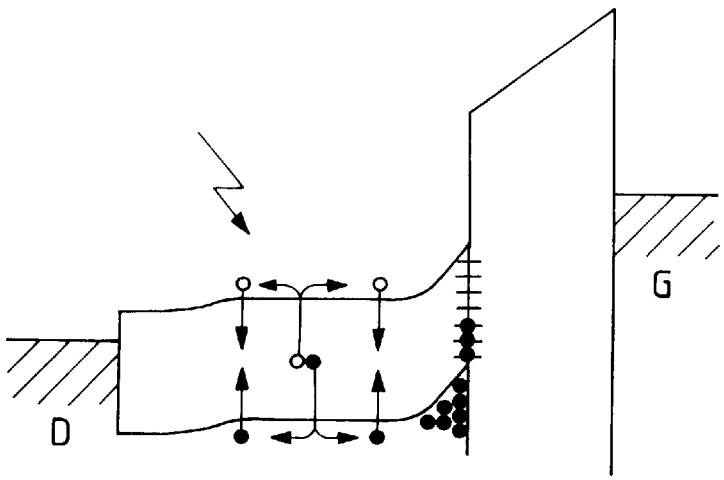
Figure 20A:
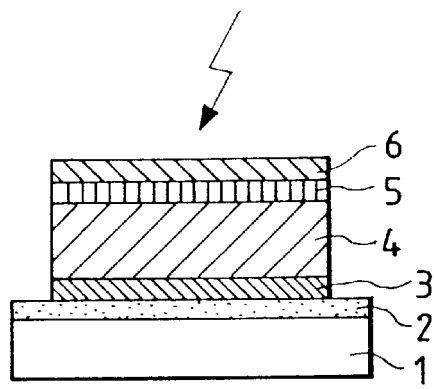
FIGS. 20A to 20C are schematic sectional views and a circuit diagram for explaining examples of the arrangement of an optical sensor.
Figure 20B:
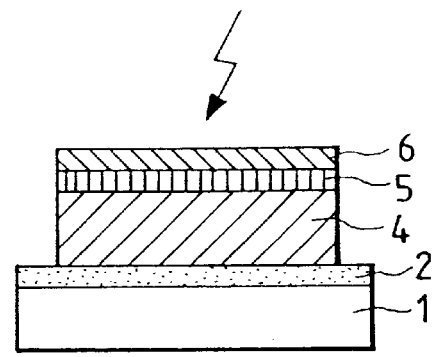
Figure 20C:
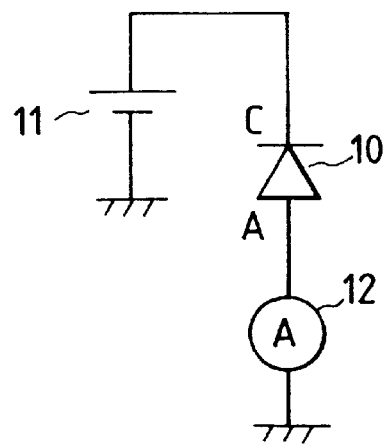

FIGS. 19A to 19C are energy band diagrams representing the operation of the photoelectric conversion element 100 in a case in which $V_{rG} < V_D - V_{FB}$, and corresponding to the energy band diagrams shown in FIGS. 16A to 16C.

In the refresh mode in FIG. 19A, since a positive potential is applied to the D electrode in relation to the G electrode, some of the holes in the i-layer 4 which are indicated by the full circles are guided to the D electrode by an electric field. At the same time, the electrons indicated by the open circles are injected into the i-layer 4. In this case, almost no holes trapped in the interface defects between the i-layer 4 and the insulating layer 70 move, and no electrons are trapped in the interface defects.

When the photoelectric conversion mode in FIG. 19B is set in this state, since a large negative potential is applied to the G electrode in relation to the D electrode, the electrons in the i-layer 4 are instantly guided to the D electrode. However, since almost no electrons are trapped in the interface defects, almost no inrush current, which poses a problem in the photoelectric conversion apparatus in FIG. 13, is present.

FIG. 19C shows a state after the photoelectric conversion mode in FIG. 19B is kept for a certain period of time.

When a refresh operation is performed under the condition of $V_{rG} < V_D - V_{FB}$ in this manner, since almost no electrons are present in the interface defects between the i-layer 4 and the insulating layer 70, a long period of time is not spent to input/output electrons. As a result, an inrush current which causes noise components can be greatly reduced.

In this refresh condition, however, the dynamic range (D·R) of the photoelectric conversion element 100 in FIG. 17 becomes $D·R = V_{rG} \times C_S$. That is, the dynamic range in the case of $V_{rG} < V_D - V_{FB}$ becomes narrower than that in the case of $V_{rG} \geq V_D - V_{FB}$. For this reason, if signal processing is performed in large quantities, charges generated by signal light are saturated to decrease the S/N ratio.

[First Embodiment]

Figure 1:
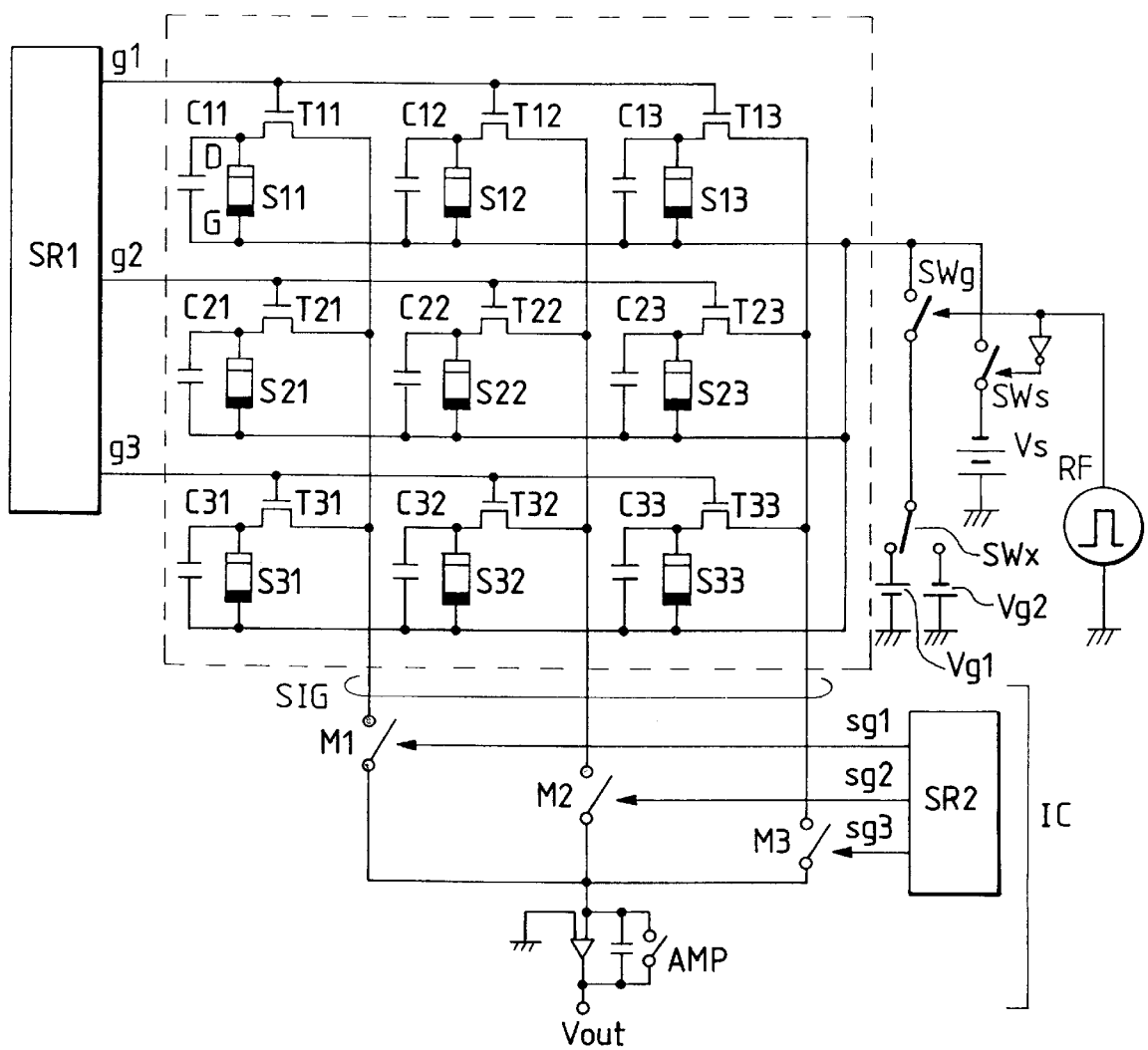
FIG. 1 is a schematic circuit diagram for explaining a photoelectric conversion apparatus according to the first embodiment of the present invention.
Figure 2A:
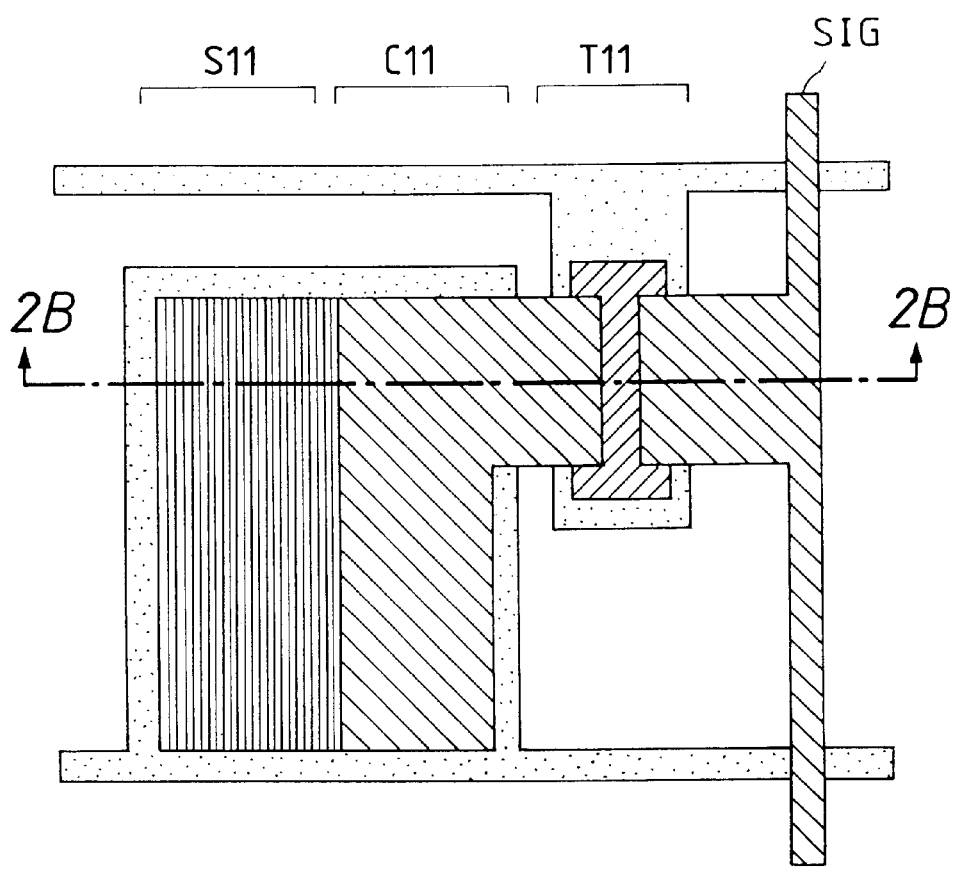
FIGS. 2A and 2B are respectively a schematic plan view and a schematic sectional view for explaining an example of the photoelectric conversion apparatus of the present invention.
Figure 2B:
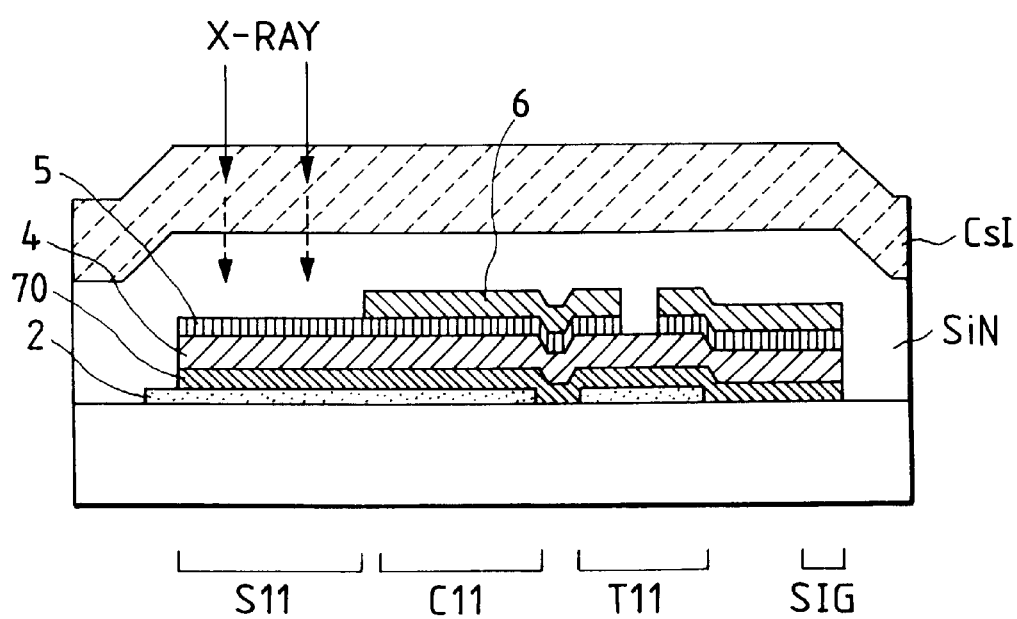

FIG. 1 is a circuit diagram showing the overall arrangement of a photoelectric conversion apparatus according to the first embodiment of the present invention. FIG. 2A is a plan view showing an element corresponding to one pixel of this embodiment. FIG. 2B is a sectional view taken along a line 2B—2B in FIG. 2A.

Referring to FIG. 1, this apparatus includes photoelectric conversion elements S11 to S33. The lower and upper electrode sides of each element are respectively indicated by "G" and "D". The apparatus also includes storage capacitors C11 to C33, transfer TFTs T11 to T33, a read power supply $V_s$, and refresh power supplies Vg1 and Vg2. The refresh power supplies are switched by a switch SWx as a mode switching means for switching the refresh modes. The read power supply $V_s$ is commonly connected to the G electrodes of all the photoelectric conversion elements S11 to S33 through a switch SWs. The refresh power supply Vg1 or Vg2 is commonly connected to the G electrodes of the elements S11 to S33 through a switch SWg. In this case, the potentials of the respective power supplies which are applied to the G electrode of each sensor are set such that Vg1>0>Vg2>$V_S$. The switch SWs is connected to a refresh control circuit RF through an inverter, and the switch SWg is directly connected to the refresh control circuit RF. The switch SWg is controlled to be kept ON in the refresh interval, and the switch SWs is controlled to be kept ON in other intervals. One pixel is constituted by one photoelectric conversion element, one capacitor, and one TFT. The signal output from each pixel is connected to a detection integrated circuit IC through a signal line.

In the photoelectric conversion apparatus of this embodiment, a total of nine pixels are divided into three blocks, the outputs from three pixels per block are transferred through each signal line SIG at the same time, and the outputs are sequentially converted into outputs (Vout) by the detection integrated circuit IC. The three pixels in each block are arranged in the horizontal direction, and the three blocks are sequentially arranged in the vertical direction, thereby two-dimensionally arranging the pixels. As is apparent, the number of pixels is set to be nine for the sake of descriptive convenience. For example, 1,000×1,000 pixels are arranged in an actual apparatus.

The portion enclosed within the dotted line in FIG. 1 is formed on a single insulating substrate having a large area. FIG. 2A is a plan view showing a portion corresponding to the first pixel of the above portion. FIG. 2B is a sectional view taken along a line 2B—2B of the portion in FIG. 2A.

Referring to FIG. 2, this structure includes the photoelectric conversion element S11 constituted by a MIS semiconductor element, the TFT T11, the capacitor C11, and the signal line SIG. In this embodiment, the capacitor C11 and the photoelectric conversion element S1 are not isolated from each other, and the capacitor C11 is formed by increasing the area of an electrode of the photoelectric conversion element S11. Such a formation process can be employed because each photoelectric conversion and each capacitor in this embodiment have the same layer structure.

In addition, a passivation silicon nitride film (SiN) and a phosphor (CsI) such as cesium iodide are formed on each pixel. When X-rays are incident on the pixel, the X-rays are converted into light (indicated by the dotted arrows) by the phosphor (CsI), and this light is incident on the photoelectric conversion element.

Figure 3:
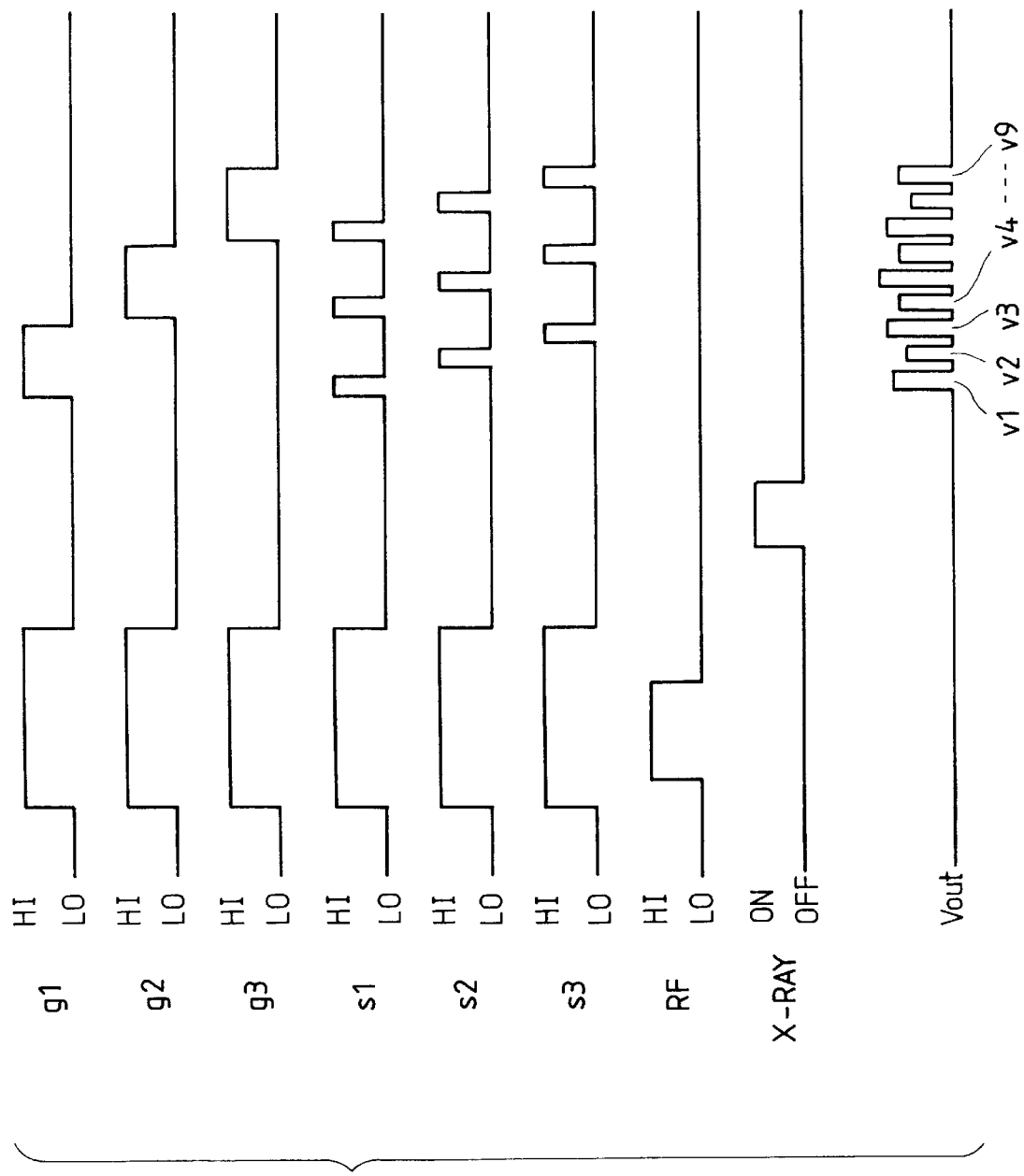
FIG. 3 is a timing chart for explaining the operation of the photoelectric conversion apparatus of the present invention.

The operation of the photoelectric conversion apparatus of this embodiment will be described next with reference to FIGS. 1 to 3. FIG. 3 is a timing chart showing the operation of this embodiment.

First of all, High-level signals are applied from shift registers SR1 and SR2 to control lines g1 to g3 and sg1 to sg3. As a result, the transfer TFTs T11 to T33 and switches M1 to M3 are turned on, and the D electrodes of all the photoelectric conversion elements S11 to S33 are set to the GND potential as a reference potential (because the input terminal of an integrating detector Amp is set to the GND potential).

At the same time, the refresh control circuit RF outputs a High-level signal to turn on the switch SWg. As a result, the G electrodes of the photoelectric conversion elements S11 to S33 are set to the potential of the refresh power supply Vg1 or Vg2. At this time, two refresh power supplies, i.e., a positive potential (Vg1) and a negative potential (Vg2), are prepared, and each G electrode is selectively connected to one of the power supplies through the switch SWx as the mode switching means.

When the refresh power supply Vg1 is selected, since the same condition as that of $V_{rG} \geq V_D - V_{FB}$ as described with reference to FIG. 13 is set, an inrush current is generated in large quantities, and noise increases as compared with the above case in which the refresh power supply Vg2 is selected, and the condition of $V_{rG} < V_D - V_{FB}$ in FIG. 17 is selected. However, the dynamic range of each photoelectric conversion element is broadened.

Subsequently, all the photoelectric conversion elements S11 to S33 are set in the refresh mode to be refreshed.

When the refresh control circuit RF outputs a Low-level signal to turn on the switch SWs, the G electrodes of all the photoelectric conversion elements S11 to S33 are se to a negative potential by the read power supply $V_s$. As a result, all the photoelectric conversion elements S11 to S33 are set in the photoelectric conversion mode. At the same time, the capacitors C11 to C33 are initialized. In this state, the shift registers SR1 and SR2 apply Low-level signals to the control lines g1 to g3 and sg1 to sg3. As a result, the switches M1 to M3 for the transfer TFTs T11 to T33 are turned off, and the D electrodes of all the photoelectric conversion elements S11 to S33 are set in the open state in terms of the DC component. However, the potentials of the D electrodes are held by the capacitors C11 to C33.

At this time, however, since no X-rays are incident, light is incident on none of the photoelectric conversion elements S11 to S33. No photocurrents therefore flow. When X-rays are emitted in the form of pulses and traverse a human body or the like to be incident on the phosphor CsI, the X-rays are converted into light. The light is incident on each of the photoelectric conversion elements S11 to S33. The light contains information of the internal structure of the human body or the like.

Photocurrents generated by the light are stored as charges in the capacitors C11 to C33 and held after the incidence of the X-rays. Thereafter, the shift register SR1 applies a high-level control pulse to the control line g1, and the shift register SR2 applies control pulses to the control lines sg1 to sg3. As a result, data v1 to v3 are sequentially output through the transfer TFTs T11 to T33 and the switches M1 to M3. With this process, two-dimensional data v1 to v9 of the internal structure of the human body or the like can be obtained.

A still image can be obtained by the above operation. When, however, a motion image is to be obtained, the above operation is repeated. In general, when a motion image is to be obtained, the intensity of X-rays to be irradiated tends to be low, and the irradiation time tends to be long as compared with a case in which a still image is to be obtained. For this reason, the amount of signal light increases, and a wide dynamic range is required. Furthermore, in obtaining a motion image, positioning is generally performed roughly, and noise and the like can be neglected to some extent in many cases. For this reason, in obtaining a still image, the above condition of $V_{rG} < V_D - V_{FB}$, i.e., the refresh power supply Vg2, is preferably selected. In obtaining a motion image, the condition of $V_{rG} \geq V_D - V_{FB}$, i.e., the refresh power supply Vg1, which allows a wide dynamic range, is preferably selected. As described above, in this embodiment, the refresh voltages can be switched by the mode switching means (refresh voltage changing means) in accordance with the type of image required.

In this case, since the photoelectric conversion element has the same structure as that shown in FIG. 9A, an n-type layer is formed as an injection inhibiting layer between the i-layer and the second electrode layer, and carriers to be inhibited from being injected are holes. If, therefore, the charge of one carrier to be inhibited from being injected is represented by q, q>0.

In the above embodiment, the relationship between holes and electrons may be reversed. For example, a p-layer may be used as an injection inhibiting layer. In this case, in the above embodiment, if the directions of the voltage and the electric field are reversed, and the remaining portion is kept unchanged, the same operation result as that obtained in the above embodiment can be obtained. In this case, the charge q of one carrier to be inhibited by the injection inhibiting layer from being injected satisfies q<0.

As described above, according to this embodiment, there is provided a photoelectric conversion apparatus including a photoelectric conversion element formed by depositing, on an insulating substrate, a first electrode layer, a first insulating layer for inhibiting passage of carriers of a first type and carriers of a second type having a polarity opposite to that of the carriers of the first type, a photoelectric conversion semiconductor layer, an injection inhibiting layer for inhibiting the carriers of the first type from being injected into the semiconductor layer, and a second electrode layer, characterized by comprising a refresh mode operation means having a first refresh mode of applying an electric field to each layer to set $$(V_{rG} \cdot q) < (V_D - V_{FB}) \cdot q \tag{1}$$

where $V_{rG}$ is the voltage of the first electrode layer of the photoelectric conversion element, q is the charge of a carrier of the first type, $V_D$ is the voltage of the second electrode layer, and $V_{FB}$ is a threshold voltage, and a second refresh mode of applying an electric field to each layer to set $$(V_{rG} \cdot q) \geq (V_D - V_{FB}) \cdot q \tag{2}$$

and a switch means for switching the refresh modes and causing the apparatus to operate in one of the modes.

In this embodiment, the G electrodes of the photoelectric conversion elements are commonly connected, and the common line is controlled to be set to the potential of the refresh power supply V1 or Vg2 and the potential of the read power supply $V_s$ via the switches $SW_g$ and $SW_s$. For this reason, all the photoelectric conversion elements can be switched to the refresh mode or the photoelectric conversion mode at once. Therefore, an optical output can be obtained with one TFT per pixel without complicated control.

In the above embodiment, the nine pixels are two-dimensionally arranged in a 3×3 matrix, and three pixel data are transferred and output, at a time, three times. However, the present invention is not limited to this. If, for example, 2,000×2,000 pixels are two-dimensionally arranged such that 5×5 pixels are arranged per 1 $mm^2$, a 40 cm×40 cm X-ray detector can be obtained.

If this detector is combined with an X-ray generator, instead of an X-ray film, to constitute an X-ray apparatus, the apparatus can be used for an X-ray chest examination and a breast cancer examination. The output from the apparatus can be instantly displayed on a CRT. In addition, this output can be converted into digital data, and a computer is used to perform image processing of the data to convert it into an output in accordance with the application. Furthermore, this data can be stored in a magnetooptic disk, and a past image can be instantly retrieved. The sensitivity of this detector is higher than that of a film so that a clear image can be obtained with weak X-rays having little effect on human bodies.

Figure 4:
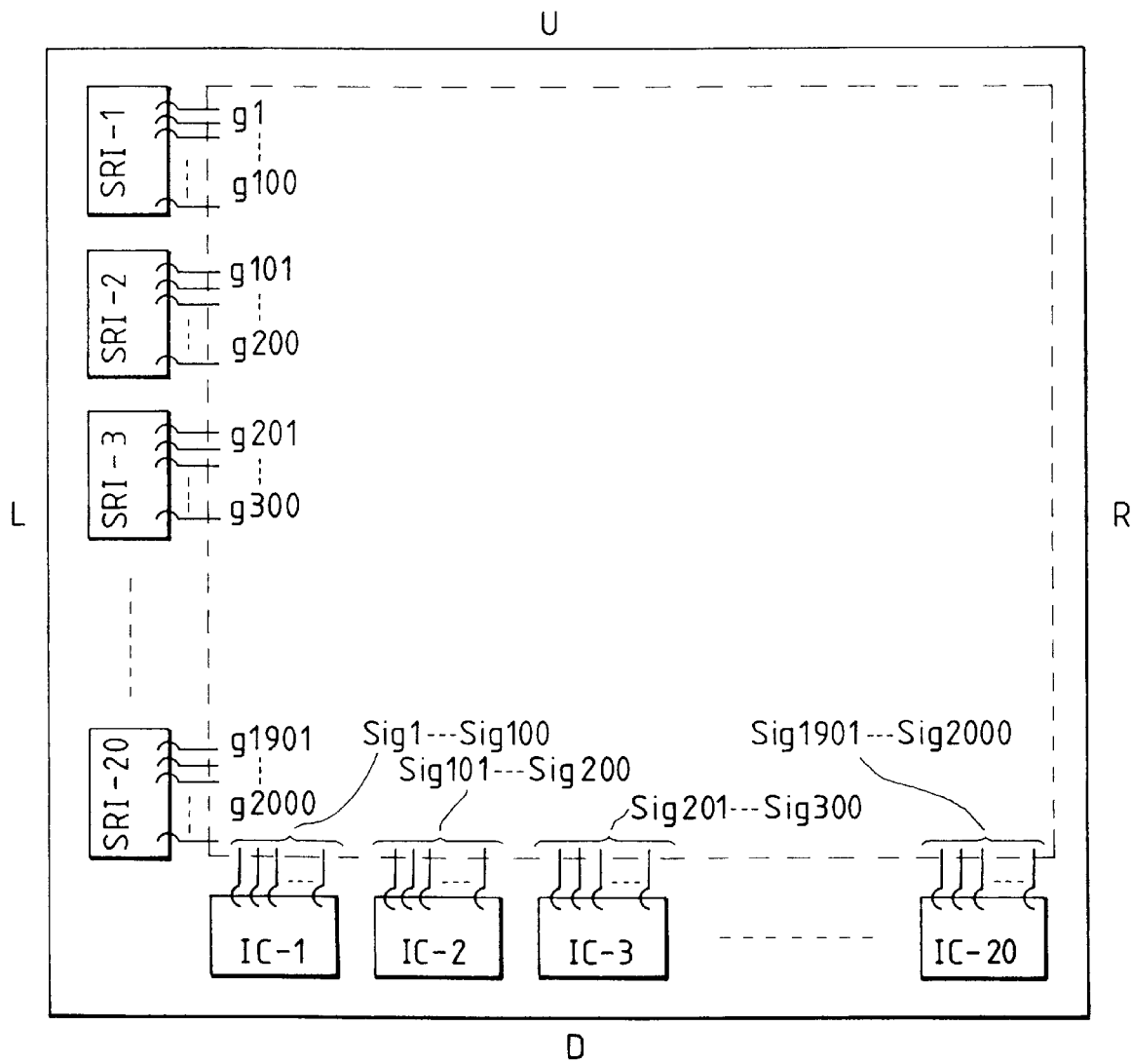
FIG. 4 is a schematic view for explaining the arrangement of an embodiment of the photoelectric conversion apparatus of the present invention.
Figure 5:
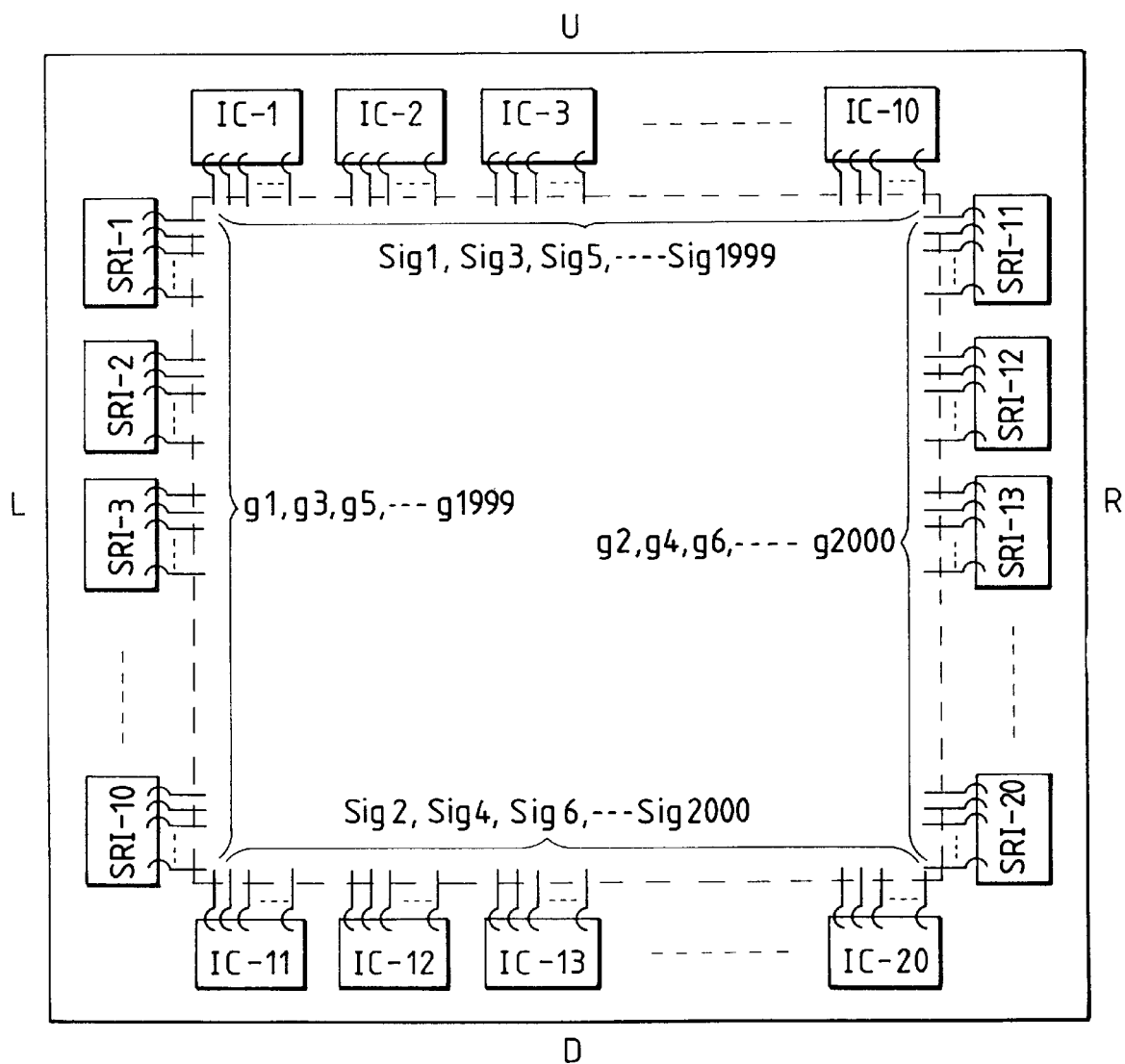
FIG. 5 is a schematic view for explaining the arrangement of another embodiment of the photoelectric conversion apparatus of the present invention.

FIGS. 4 and 5 are schematic views each showing the arrangement of a detector having 2,000×2,000 pixels. When a detector having 2,000×2,000 pixels is to be formed, the numbers of elements in the portion enclosed within the dotted line in FIG. 1 may be increased in the vertical and horizontal directions. In this case, however, 2,000 control lines, i.e., lines g1 to g2000, and 2,000 signal lines SIG, i.e., lines sig1 to sig2000 are required. In addition, the shift register SR1 and the detection integrated circuit IC need to perform control/processing of 2,000 signals, and hence the apparatus increases in size. If such processing is performed using one-chip elements, the size of one chip becomes very large, resulting in disadvantages in terms of yielding ratio, cost, and the like.

In view of the foregoing, for example, 2,000 shift registers SR1 may be divided into 20 chips (SR1-1 to SR1-20) each including 100 shift registers. Similarly, 2,000 detection integrated circuits may be divided into 20 chips (IC1 to IC20) each including 100 processing circuits.

Referring to FIG. 4, 20 chips (SR1-1 to SR1-20) are mounted on the left side (L), and 20 chips (IC1 to IC20) are mounted on the down side (D), while 100 control lines or 100 signal lines are connected to each chip by wire bonding. The portion enclosed within the dotted line in FIG. 4 corresponds to the portion enclosed with the dotted line in FIG. 1. Referring to FIG. 4, illustration of connection to an external unit is omitted, and illustration of switches SWg, SWs, and SWx, power supplies Vg1, Vg2, and RF, and the like is also omitted. Although 20 outputs (Vout) are obtained from the integrated circuits IC1 to IC20, these outputs may be combined into one output through a switch or the like, or the 20 outputs may be directly output to be subjected to parallel processing.

As shown in FIG. 5, 10 chips (SR1-1 to SR1-10) may be mounted on the left side (L); 10 chips (SR1-11 to SR1-20), on the right side (R); 10 chips (IC1 to IC10), on the upper side; and 10 chips (IC11 to IC20), on the down side (D). In this arrangement, since the respective lines are distributed to the upper, down, left, and right sides (U, D, L, and R) in units of 1,000, the density of lines on each side decreases, and the density of wiring bonding on each side also decreases, resulting in an increase in yielding ratio.

The lines are distributed such that the lines g1, g3, g5, ..., g1999 are distributed on the left side (L), and the lines g2, g4, g6, ..., g2000 are distributed on the right side (R). That is, the odd-numbered control lines are distributed on the left side (L), and the even-numbered control lines are distributed on the right side (R). With this distribution, since the respective lines are arranged and wired at equal intervals, no density irregularity occurs. Consequently, the yielding ratio can be further increased. It suffices if the remaining lines are distributed on the upper side (U) and the down side (D) in the same manner as described above. According to another embodiment, although not shown, lines g1 to g100, g201 to g300, ..., g1801 to g1900 are distributed on the left side (L), and lines g101 to g200, g301 to g400, ..., g1901 to g2000 are distributed on the right side (R). That is, consecutive control lines are distributed to each chip, and such groups of lines are alternately distributed on the right and left sides (R and L). With this distribution, continuous control is allowed within one chip, and the drive timings can be easily set, so a simple, inexpensive circuit can be used. Distribution of lines on the upper side (U) and the down side (D) is performed in the same manner as described above, so continuous processing can be performed, and an inexpensive circuit can be used.

That is, there is provided a photoelectric conversion apparatus characterized in that a plurality of photoelectric conversion elements are one- or two-dimensionally arranged, all the photoelectric conversion elements are divided into a plurality of blocks, and switch elements connected to the respective photoelectric conversion elements are operated in units of blocks to output optical signals from all the photoelectric conversion elements divided into the plurality of blocks to matrix signal lines.

The photoelectric conversion apparatus is also characterized in that each of the intersections between the matrix signal lines is constituted by a multilayered structure in which at least a first electrode layer, an insulating layer, a semiconductor layer, and a second electrode layer are sequentially stacked, and the respective layers of the multilayered structure are formed from the same layers as those of a first electrode layer, an insulating layer, a photoelectric conversion semiconductor layer, and a second electrode layer of the photoelectric conversion element, and have the same thicknesses as those of the respective layers of the photoelectric conversion element.

Each of the examples shown in FIGS. 4 and 5 may be obtained by mounting chips on a substrate after the circuit enclosed within the dotted line is formed on the substrate, or mounting the circuit board enclosed within the dotted line and chips on another large substrate. Alternatively, chips may be mounted on a flexible board, and the board may be bonded to the circuit board enclosed within the dotted line.

A photoelectric conversion apparatus including many pixels and having a large area, like the one described above, cannot be manufactured by complicated steps using the conventional sensors. However, in the steps in manufacturing the photoelectric conversion apparatus of the present invention, the respective elements are formed from common films at the same time. For this reason, the number of steps is small, and only simple steps are required. Therefore, a high yielding ratio can be achieved, and large-area, high-performance photoelectric conversion apparatuses can be manufactured. In addition, since a capacitor and a photoelectric conversion element can be formed within the same element, the number of elements can be substantially reduced to one-half. A further increase in yielding ratio can be attained.

[Second Embodiment]

Figure 6:
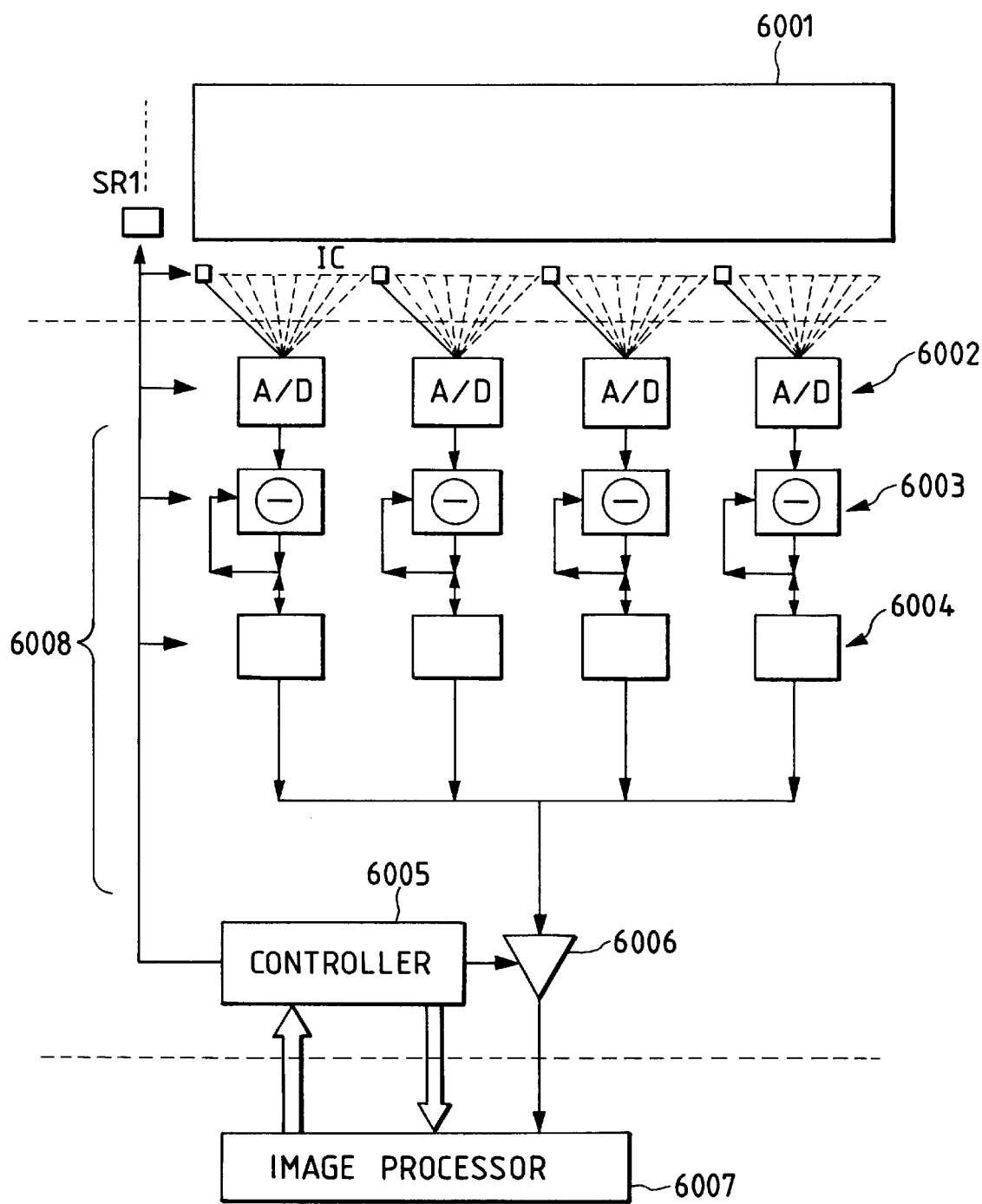
FIG. 6 is a block diagram for explaining a system having the photoelectric conversion apparatus of the present invention.

FIG. 6 is a block diagram showing an overall system using a photoelectric conversion apparatus of the present invention. This system includes an a-Si sensor substrate 6001 having a photoelectric conversion apparatus having the same arrangement as that described with reference to FIGS. 2A, 2B, and 3. Referring to FIG. 6, a plurality of shift registers SR1 are connected in series, and a plurality of detection integrated circuits IC are driven. The outputs from the detection integrated circuits IC are input to analog-digital converters 6002 in a processing circuit 6008 so as to be converted into digital data. The outputs are stored in memories 6004 through fixed pattern correction subtracters 6003. The data in the memories 6004 are transferred to an image processor 6007 serving as a signal processing means through a buffer 6006 under the control of a controller 6005, and is subjected to image processing in the image processor.

Figure 7A:
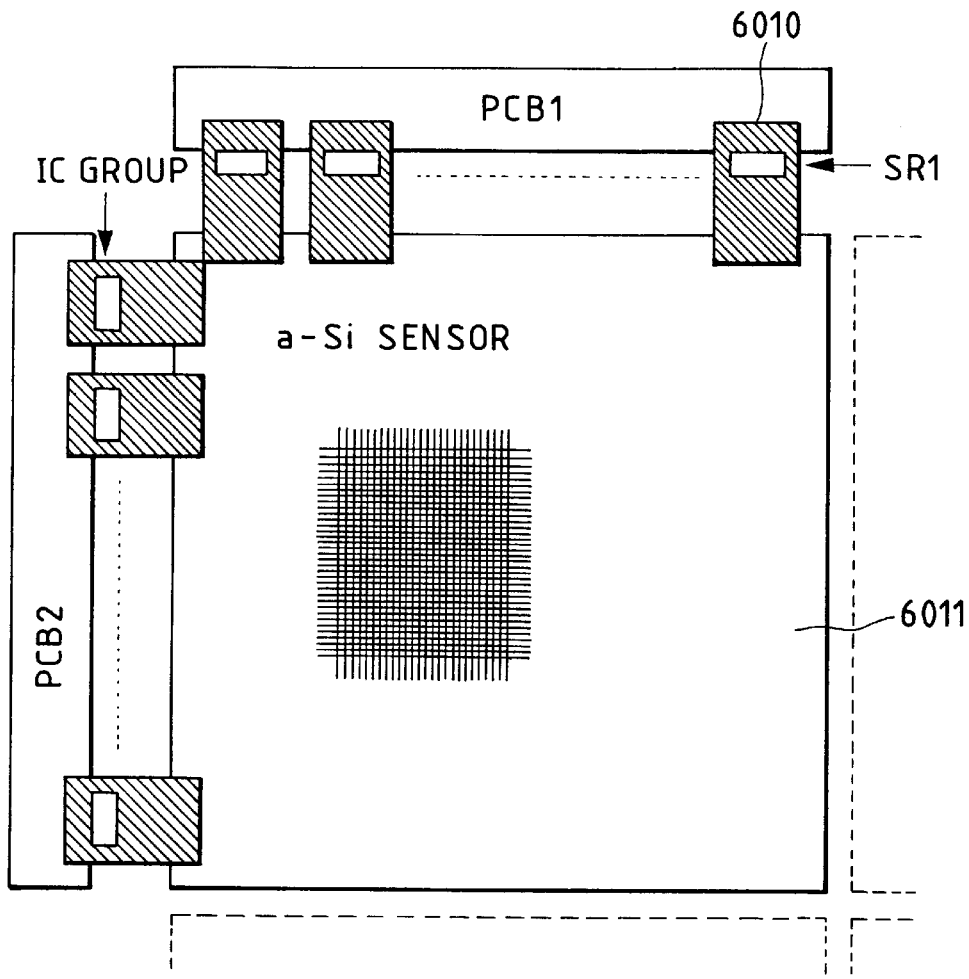
FIGS. 7A and 7B are respectively a schematic view and a schematic sectional view for explaining a case wherein the present invention is applied to an X-ray detection apparatus.
Figure 7B:
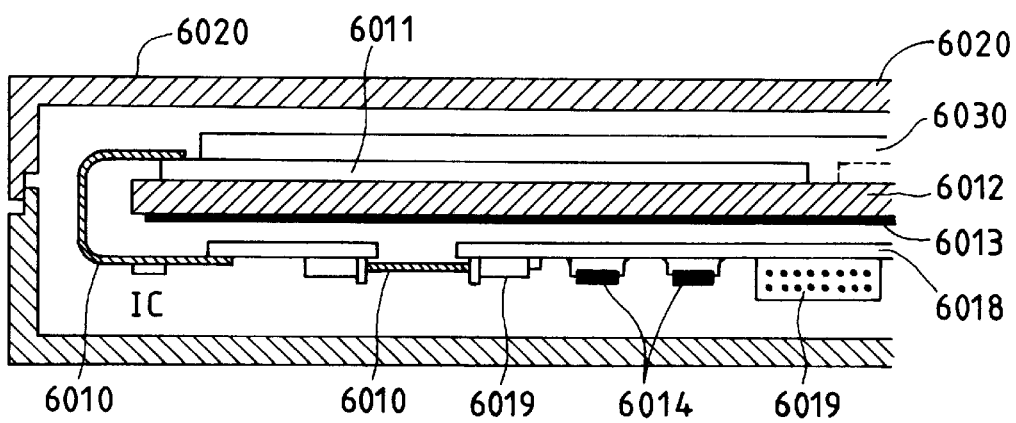

FIGS. 7A and 7B are respectively a schematic view and a sectional view showing a case in which the present invention is applied to an X-ray detection photoelectric conversion apparatus.

A plurality of photoelectric conversion elements and TFTs are formed within an a-Si sensor substrate 6011, and flexible circuit boards 6010 on which shift registers SR1 and detection integrated circuits IC are mounted are connected to the a-Si sensor substrate 6011. The opposite side of the flexible circuit boards 6010 to the side on which the shift registers SR1 and the integrated circuits are mounted is connected to circuit boards PCB1 and PCB2. A lead plate 6013 for protecting memories 6014 in a processing circuit 6018 again X-rays is mounted below a base 6012 on which a plurality of a-Si sensor substrates 6011 are bonded to form a large photoelectric conversion apparatus. A phosphor 6030 such as CsI for converting X-rays into visible light is applied or bonded on the a-Si sensor substrate 6011. This apparatus can detect X-rays on the basis of the same principle as that of the X-ray detection method described with reference to FIGS. 1 to 2B. In this embodiment, the overall structure is housed in a carbon fiber case 6020, as shown in FIG. 7B.

Figure 8:
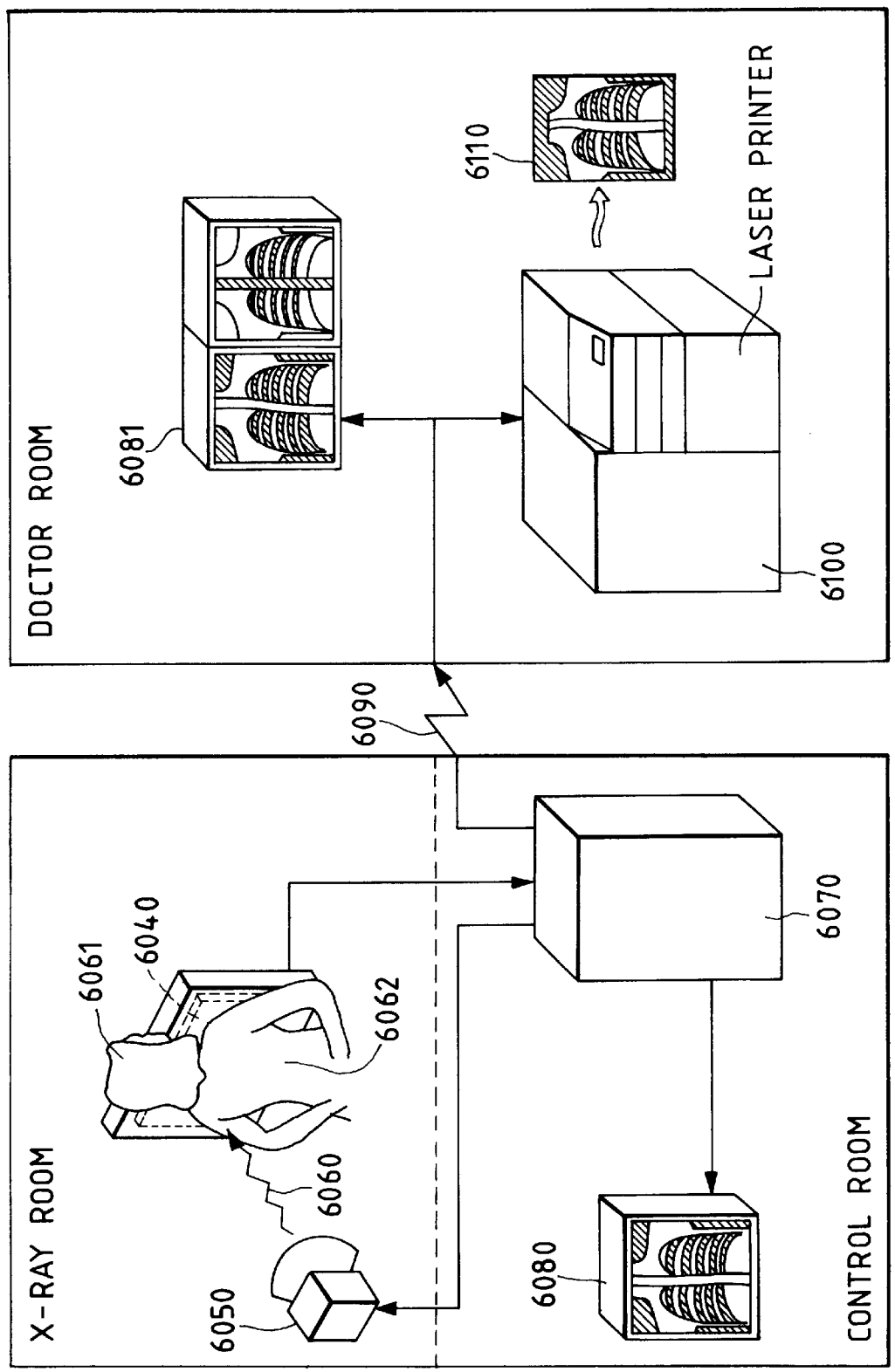
FIG. 8 is a view showing the arrangement of a system having the photoelectric conversion of the present invention to explain the system.

FIG. 8 shows an application of the photoelectric conversion apparatus of the present invention to an X-ray diagnosis system.

X-rays 6060 generated by an X-ray tube 6050 are transmitted through a chest 6062 of a patient or object 6061 to be examined, and incident on a photoelectric conversion apparatus 6040 on which a phosphor is mounted. The incident X-rays contain information of an internal portion of the body of the patient 6061. Upon incidence of the X-rays, the phosphor emits light. The light is photoelectrically converted to obtain electrical information. This information is converted into digital information and subjected to image processing in an image processor 6070. The resultant image can be observed on a display 6080 in a control room.

This information can be transferred to a remote place by a transmission means such as a telephone line 6090. The information can be displayed on a display 6081 or stored in an optical disk or the like in a doctor room at a different place, thereby allowing a doctor at the remote place to perform diagnosis. In addition, the information can be recorded on a film 6110 by a film processor 6100.

As has been described above, according to the photoelectric conversion apparatus of the present invention, when each photoelectric conversion element is in the refresh mode, the refresh power supplies can be switched by using the switches, and the potential of the D electrode can be set to be higher or lower than the potential of the G electrode. With this switching operation, the apparatus realizes both the mode requiring a wide dynamic range in obtaining a motion image and the mode requiring a reduction in noise in obtaining a still image. In the above embodiments, the refresh voltage can be changed for each image, and hence required images can be obtained.

In addition, as described above, according to the present invention, a photoelectric conversion apparatus with a high S/N ratio and stable characteristics, a driving method therefor, and a system having the apparatus can be provided.

Furthermore, by using the above photoelectric conversion apparatus having excellent characteristics, a facsimile apparatus or X-ray apparatus which has a large area, high performance, and excellent characteristics can be provided at a low cost.

What is claimed is:

1. A driving method for a photoelectric conversion apparatus comprising:
   a photoelectric conversion element having first and second electrodes; and
   mode switching means for performing a refresh operation for said photoelectric conversion element by switching between a first refresh mode of setting a potential of said first electrode to be higher than a potential of said second electrode, and a second refresh mode of setting the potential of said first electrode to be lower than the potential of said second electrode, wherein said photoelectric conversion element is formed by depositing, on an insulating substrate, a first electrode layer, a first insulating layer for inhibiting passage of carriers of a first type and carriers of a second type having a polarity opposite to that of the carriers of the first type, a photoelectric conversion semiconductor layer, an injection inhibiting layer for inhibiting the carriers of the first type from being injected into the semiconductor layer, and a second layer,
   said apparatus further comprising refresh mode operation means operating in the first refresh mode of applying an electric field to each layer to set $$(V_{rG}q) < (V_D - V_{FB})q \qquad (1)$$

where $V_{rG}$ is the voltage of the first electrode layer of said photoelectric conversion element, q is the charge of a carrier of the first type, $V_D$ is the voltage of the second electrode layer, and $V_{FB}$ is a threshold voltage, and operating in the second refresh mode of applying an electric field to set $$(V_{rG}q) \geq (V_D - V_{FB})q \qquad (2),$$

said mode switching means switching between the first and second refresh modes and causing said apparatus to operate in one of the modes, wherein switching is performed to set the first refresh mode of applying an electric field to each layer to set $$(V_{rG}q) < (V_D - V_{FB})q \qquad (1)$$

when a still image is to be obtained, and switching is performed to set the second refresh mode of applying an electric field to set $$(V_{rG}q) \geq (V_D - V_{FB})q \qquad (2)$$

when a moving image is to be obtained.

2. A photoelectric conversion apparatus comprising:
   a photoelectric conversion element having first and second electrodes; and
   mode switching means for performing a refresh operation for said photoelectric conversion element by switching between a first refresh mode of setting a potential of said first electrode to be higher than a potential of said second electrode, and a second refresh mode of setting the potential of said first electrode to be lower than the potential of said second electrode, wherein the first refresh mode is set when a still image is obtained and the second refresh mode is set when a moving image is obtained.

3. A photoelectric conversion apparatus comprising:
   a photoelectric conversion element having a pair of electrodes and having a semiconductor layer and an injection inhibiting layer between said pair of electrodes; and
   a circuit for applying a sensing voltage between said pair of electrodes to effect a sensing of said photoelectric conversion element;
   a refresh circuit for applying a refresh voltage between said pair of electrodes for refreshing said photoelectric conversion element,
   wherein said refresh circuit comprises a switch for alternatively selecting either application of a refresh voltage of a first polarity between said pair of electrodes, or application of a refresh voltage of a second polarity, opposite to said first polarity between said pair of electrodes,
   wherein said switch is turned on in changing between still image reading and moving image reading.

4. A photoelectric conversion apparatus comprising:
   a photoelectric conversion element having a pair of electrodes and having a semiconductor layer and an injection inhibiting layer between said pair of electrodes;
   a circuit for applying a sensing voltage between said pair of electrodes to effect a sensing of said photoelectric conversion element; and
   a refresh circuit for applying a refresh voltage between said pair of electrodes for refreshing said photoelectric conversion element,
   wherein said refresh circuit comprises a switch for alternatively selecting either application of
   (i) a first refresh voltage between said pair of electrodes, said first refresh voltage satisfying the following equation (1):

$$V_{rG} < V_D - V_{FB} \quad (1)$$

where:
- $V_{rG}$ is the voltage of a first electrode of said pair of electrodes,
- $V_D$ is the voltage of a second electrode of said pair of electrodes, and
- $V_{FB}$ is a threshold voltage, or (ii) application of a second refresh voltage between said pair of electrodes, said second refresh voltage satisfying the following equation (2):

$$V_{rG} \geq V_D - V_{FB} \quad (2)$$

wherein said switch is turned on when changing between still image reading and moving image reading.

5. An X-ray image pick-up apparatus comprising:
a photoelectric conversion apparatus according to claim 4;
a phosphor, formed on said photoelectric conversion element, for converting X-rays to light; and
an X-ray source.

6. A photoelectric conversion apparatus comprising:
a photoelectric conversion element having first and second electrodes; and
mode switching means for performing a refresh operation for said photoelectric conversion element by switching between a first refresh mode and a second refresh mode,
wherein the switching is effected when changing between still image reading and moving image reading,
wherein said apparatus is driven to obtain a desired photoelectric conversion signal by selectively changing a refresh voltage for said photoelectric conversion element, and
wherein said refresh voltage is set such that in said first refresh mode, the relationship $V_{rG} < V_D - V_{FB}$ is satisfied, where:
- $V_{rG}$ is the voltage of a first electrode of said pair of electrodes,
- $V_D$ is the voltage of a second electrode of said pair of electrodes, and
- $V_{FB}$ is a threshold voltage, and that in said second refresh mode, the relationship $V_{rG} > V_D - V_{FB}$ is satisfied.

7. An apparatus according to claim 2, wherein said mode switching means can select between refresh power supplies of different voltages.

8. An apparatus according to claim 3, wherein said switch can select between refresh power supplies of different voltages.

9. An apparatus according to claim 4, wherein said switch can select between refresh power supplies of different voltages.

10. An apparatus according to claim 2, wherein a plurality of photoelectric conversion elements, each identical to said photoelectric conversion element, are one- or two-dimensionally arranged, all said photoelectric conversion elements are divided into a plurality of blocks, and said mode switching means are respectively connected to said photoelectric conversion elements and are operated in units of blocks to output optical signals from all said photoelectric conversion elements divided into the plurality of blocks to matrix signal lines.

11. An apparatus according to claim 10, wherein each of intersections between the matrix signal lines is constituted by a multilayered structure in which at least a first electrode layer, an insulating layer, a semiconductor layer, and a second electrode layer are sequentially stacked, and respective layers of the multilayered structure are formed from identical layers as those of a first electrode layer, an insulating layer, a photoelectric conversion semiconductor layer, and a second electrode layer of said photoelectric conversion element, and have the same thicknesses as those of corresponding respective layers of said photoelectric conversion element.

12. An apparatus according to claim 3, wherein a plurality of photoelectric conversion elements, each identical to said photoelectric conversion element, are one- or two-dimensionally arranged, all said photoelectric conversion elements are divided into a plurality of blocks, and switch elements respectively connected to said photoelectric conversion elements are operated in units of blocks to output optical signals from all said photoelectric conversion elements divided into the plurality of blocks to matrix signal lines.

13. An apparatus according to claim 12, wherein each of intersections between the matrix signal lines is constituted by a multilayered structure in which at least a first electrode layer, an insulating layer, a semiconductor layer, and a second electrode layer are sequentially stacked, and respective layers of the multilayered structure are formed from identical layers as those of a first electrode layer, an insulating layer, a photoelectric conversion semiconductor layer, and a second electrode layer of said photoelectric conversion element, and have the same thicknesses as those of corresponding respective layers of said photoelectric conversion element.

14. An apparatus according to claim 4, wherein a plurality of photoelectric conversion elements each identical to said photoelectric conversion element are one- or two-dimensionally arranged, all said photoelectric conversion elements are divided into a plurality of blocks, and switch elements respectively connected to said photoelectric conversion elements are operated in units of blocks to output optical signals from all said photoelectric conversion elements divided into the plurality of blocks to matrix signal lines.

15. An apparatus according to claim 14, wherein each of intersections between the matrix signal lines is constituted by a multilayered structure in which at least a first electrode layer, an insulating layer, a semiconductor layer, and a second electrode layer are sequentially stacked, and respective layers of the multilayered structure are formed from identical layers as those of a first electrode layer, an insulating layer, a photoelectric conversion semiconductor layer, and a second electrode layer of said photoelectric conversion element, and have the same thicknesses as those of corresponding respective layers of said photoelectric conversion element.

16. An X-ray image pick-up apparatus comprising:
a photoelectric conversion apparatus according to claim 2;
signal processing means for processing a signal from said photoelectric conversion apparatus;
recording means for recording a signal from said signal processing means;
display means for displaying the signal from said signal processing means; and
transmission means for transmitting the signal from said signal processing means.

17. An X-ray image pick-up apparatus comprising:
a photoelectric conversion apparatus according to claim 3;
signal processing means for processing a signal from said photoelectric conversion apparatus;

recording means for recording a signal from said signal processing means;

display means for displaying the signal from said signal processing means; and transmission means for transmitting the signal from said signal processing means.

18. An X-ray image pick-up apparatus comprising:

a photoelectric conversion apparatus according to claim 4;

signal processing means for processing a signal from said photoelectric conversion apparatus;

recording means for recording a signal from said signal processing means;

display means for displaying the signal from said signal processing means; and transmission means for transmitting the signal from said signal processing means.

19. An apparatus according to claim 2, wherein said first electrode is a transparent electrode and said second electrode is an opaque electrode.

20. An apparatus according to claim 3, wherein a first electrode of said pair of electrodes is a transparent electrode and a second electrode of said pair of electrodes is an opaque electrode.

21. An apparatus according to claim 4, wherein a first electrode of said pair of electrodes is a transparent electrode and a second electrode of said pair of electrodes is an opaque electrode.

22. An apparatus according to claim 2, wherein said photoelectric conversion element comprises a plurality of photoelectric conversion elements, said first electrode is connected to a signal line through a switch element, and said second electrode is connected to said plurality of photoelectric conversion elements.

23. An apparatus according to claim 22, wherein a refresh voltage applied to said second electrode is changed.

24. An apparatus according to claim 22, wherein said second electrode is coupled to the semiconductor layer through the insulating layer.

25. An apparatus according to claim 22, wherein said photoelectric conversion element is an MIS semiconductor element.

26. An apparatus according to claim 3, wherein said photoelectric conversion element comprises a plurality of photoelectric conversion elements, a first electrode of said pair of electrodes is connected to a signal line through a switch element, and a second electrode of said pair of electrodes is connected to said plurality of photoelectric conversion elements.

27. An apparatus according to claim 26, wherein a refresh voltage applied to said second electrode is changed.

28. An apparatus according to claim 26, wherein said second electrode is coupled to the semiconductor layer through the insulating layer.

29. An apparatus according to claim 26, wherein said photoelectric conversion element is an MIS semiconductor element.

30. An apparatus according to claim 4, wherein said photoelectric conversion element comprises a plurality of photoelectric conversion elements, a first electrode of said pair of electrodes is connected to a signal line through a switch element, and a second electrode of said pair of electrodes is connected to said plurality of photoelectric conversion elements.

31. An apparatus according to claim 30, wherein a refresh voltage applied to said second electrode is changed.

32. An apparatus according to claim 30, wherein said second electrode is coupled to the semiconductor layer through the insulating layer.

33. An apparatus according to claim 30, wherein said photoelectric conversion element is an MIS semiconductor element.

34. A method according to claim 1, wherein said photoelectric conversion apparatus comprises a plurality of elements identical to said photoelectric conversion element.

35. An apparatus according to claim 2, comprising a plurality of elements identical to said photoelectric conversion element.

36. An apparatus according to claim 3, comprising a plurality of elements identical to said photoelectric conversion element.

37. An apparatus according to claim 4, comprising a plurality of elements identical to said photoelectric conversion element.

38. A photoelectric conversion apparatus comprising:

a photoelectric conversion element having first and second electrodes; and mode switching means for performing a refresh operation for said photoelectric conversion element by switching between a first refresh mode of providing a difference in a potential between said first and second electrodes such that a potential of said first electrode is higher than a potential of said second electrode, and a second refresh mode of providing between said first and said second electrodes a difference in potential different from the difference in potential provided in said first refresh mode, wherein the first refresh mode is set when a still image is obtained and the second refresh mode is set when a moving image is obtained.

* * * * *

UNITED STATES PATENT AND TRADEMARK OFFICE
CERTIFICATE OF CORRECTION

PATENT NO.   : 6,476,867 B1                                                      Page 1 of 1
DATED        : November 5, 2002
INVENTOR(S)  : Isao Kobayashi et al.

It is certified that error appears in the above-identified patent and that said Letters Patent is hereby corrected as shown below:

Column 5,
Line 61, "comprising:" should read -- comprises: --.

Column 9,
Line 66, "if," should read -- if --.

Column 11,
Line 35, "ten" should read -- tens of --.

Column 12,
Line 39, "slightly" should read -- small --.

Column 16,
Line 63, "se" should read -- set --.

Column 20,
Line 52, "again" should read -- against --.

Signed and Sealed this

Twenty-second Day of April, 2003

JAMES E. ROGAN
*Director of the United States Patent and Trademark Office*